United States Patent
Sawada et al.

(10) Patent No.: US 7,851,824 B2
(45) Date of Patent: Dec. 14, 2010

(54) LIGHT EMITTING DEVICE HAVING A COMPOSITION MODULATION LAYER OF UNEQUAL AMOUNTS OF AT LEAST TWO ELEMENTS BETWEEN AN N-TYPE CONTACT LAYER AND A TRANSPARENT ELECTRODE

(75) Inventors: Masato Sawada, Kanagawa-ken (JP); Akihiro Ooishi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 11/535,289

(22) Filed: Sep. 26, 2006

(65) Prior Publication Data
US 2007/0096076 A1    May 3, 2007

(30) Foreign Application Priority Data
Sep. 30, 2005   (JP)   ............................. 2005-289417

(51) Int. Cl.
*H01L 31/102* (2006.01)
*H01L 21/02* (2006.01)
*H01L 31/06* (2006.01)
*H01L 33/00* (2006.01)

(52) U.S. Cl. .................. 257/190; 257/185; 257/201; 257/E33.043; 257/101; 257/99

(58) Field of Classification Search .................. 257/94, 257/185, 190, 201, E33.043, 101, 99
See application file for complete search history.

(56) References Cited

U.S. PATENT DOCUMENTS 5,481,122 A * 1/1996 Jou et al. ....................... 257/94

(Continued)

FOREIGN PATENT DOCUMENTS

JP          05226640 A * 9/1993

(Continued)

OTHER PUBLICATIONS

Balasubramanian, N., and Subrahmanyam, A.: 'Schottky diode properties and the photovoltaic behaviour of indium tin oxide (ITO)/n-GaAs junctions—effect of arsenic deficient GaAs surface' Semicond. Sci. Technol., 1990, 5, pp. 870-876.*

*Primary Examiner*—Marcos D Pizarro
*Assistant Examiner*—Diana C Garrity
(74) *Attorney, Agent, or Firm*—Oblon, Spivak, McClelland, Maier & Neustadt, L.L.P.

(57) ABSTRACT

A light emitting device includes: a light emitting layer; an n-type contact layer made of a compound provided on the light emitting layer; a composition modulation layer provided on the n-type contact layer; and a transparent electrode provided on the composition modulation layer. The composition modulation layer consists of a plurality of elements which constitute the compound. A composition ratio of one of the plurality of elements is higher in the composition modulation layer than in the compound. Alternatively, the light emitting device includes: a light emitting layer; an n-type contact layer made of a compound provided on the light emitting layer; a metal layer provided on the n-type contact layer; and a transparent electrode provided on the metal layer. The metal layer is made of a metal having a lower work function than the compound.

6 Claims, 24 Drawing Sheets

U.S. PATENT DOCUMENTS

| | | | |
|---|---|---|---|
| 6,586,119 B1 | 7/2003 | Hashimoto et al. | |
| 6,963,381 B2 * | 11/2005 | Kano et al. | 349/113 |
| 2004/0012726 A1 * | 1/2004 | Kano et al. | 349/43 |

FOREIGN PATENT DOCUMENTS

| | | |
|---|---|---|
| TW | 476227 | 2/2002 |
| TW | 515116 | 12/2002 |
| TW | I228940 | 3/2005 |
| TW | I234298 | 6/2005 |

\* cited by examiner

LIGHT EMITTING DEVICE HAVING A COMPOSITION MODULATION LAYER OF UNEQUAL AMOUNTS OF AT LEAST TWO ELEMENTS BETWEEN AN N-TYPE CONTACT LAYER AND A TRANSPARENT ELECTRODE

CROSS-REFERENCE TO RELATED APPLICATIONS

This application is based upon and claims the benefit of priority from the prior Japanese Patent Application No.2005-289417, filed on Sep. 30, 2005; the entire contents of which are incorporated herein by reference

BACKGROUND OF THE INVENTION

1. Field of the Invention

This invention relates to a light emitting device and a method of manufacturing a light emitting device, and more particularly to a light emitting device and a method of manufacturing a light emitting device where current injection from the electrode and light extraction efficiency can be improved.

2. Background Art

Typically, a light emitting diode has the following basic structure: an active layer is sandwiched between a p-type cladding layer and an n-type cladding layer to form a double heterostructure, contact layers are provided above and below the double heterostructure, and a p-side electrode and an n-side electrode are connected to the contact layers, respectively. The active layer, the n-type cladding layer, and the p-type cladding layer are illustratively made of mixed crystals of group III-V compound semiconductors such as InGaAlP, InAlP, and InGaP. A prescribed emission color within the wavelength range from green to red can be obtained by adjusting the elemental composition ratio of the active layer.

A light emitting diode emits light as a result of recombination of holes and electrons in the active layer, the holes and electrons being injected from the p-side electrode and the n-side electrode, respectively. Thus, in order to achieve higher emission efficiency, it is important to improve the efficiency of injecting holes and electrons from both electrodes into the semiconductor layers. The contact layers serve to facilitate injecting holes or electrons from the electrodes. Typically, the p-type contact layer is made of p-type GaAs, and the n-type contact layer is made of n-type GaAs. Likewise, the p-side electrode and the n-side electrode formed on the contact layers should efficiently inject holes or electrons into the corresponding contact layers, and thus require ohmic contact with the contact layers. Typically, these electrodes are metal films made of AuGe alloy or AuZn alloy, for example.

However, in the contact layers and electrodes on the light extraction side, it is preferable to exclude elements that absorb or block light in order to increase the light extraction efficiency. The thickness of the GaAs layer serving as a contact layer is preferably about 100 nanometers (nm) or less so as to reduce light absorption and avoid degradation of electric conductivity. On the other hand, with respect to electrodes, because metal films cannot transmit light, it is preferable to minimize the area of the electrode. However, a certain amount of area is needed in view of the efficiency of transport and injection of electrons or holes to the entire surface of the contact layer.

As described above, it is important to improve the electrode on the light extraction side for improving the light extraction efficiency and achieving a light emitting diode with high emission efficiency. To this end, electrodes on the light extraction side made of transparent electrodes such as indium tin oxides (ITO) are proposed (JP2003-174197A).

However, when an ITO electrode forms a junction with the GaAs contact layer, it is difficult to obtain ohmic contact with sufficiently low contact resistance.

SUMMARY OF THE INVENTION

According to an aspect of the invention, there is provided a light emitting device including: a light emitting layer; an n-type contact layer made of a compound provided on the light emitting layer; a composition modulation layer provided on the n-type contact layer, the composition modulation layer consisting of a plurality of elements which constitute the compound, and a composition ratio of one of the plurality of elements being higher in the composition modulation layer than in the compound; and a transparent electrode provided on the composition modulation layer.

According to another aspect of the invention, there is provided a light emitting device including: a light emitting layer; an n-type contact layer made of a compound provided on the light emitting layer; a metal layer provided on the n-type contact layer, the metal layer being made of a metal having a lower work function than the compound; and a transparent electrode provided on the metal layer.

According to another aspect of the invention, there is provided a method of manufacturing a light emitting device, including: forming a laminated body including a light emitting layer and an n-type contact layer, the n-type contact layer being made of a compound; forming a composition modulation layer by increasing a composition ratio of one element constituting the compound exposed to a surface of the n-type contact layer; and forming a transparent electrode on the composition modulation layer.

According to another aspect of the invention, there is provided a method of manufacturing a light emitting device, including: forming a laminated body including a light emitting layer and an n-type contact layer, the n-type contact layer being made of a compound; forming a metal layer on the n-type contact layer, the metal layer being made of a metal having a lower work function than the compound; and forming a transparent electrode on the metal layer.

BRIEF DESCRIPTION OF THE DRAWINGS

FIG. 21A shows a sample with MgAg film 20 and FIG. 21B shows a sample without MgAg film 20.

DETAILED DESCRIPTION OF THE INVENTION

Embodiments of the invention will now be described with reference to the drawings.

First Embodiment

Figure 1:
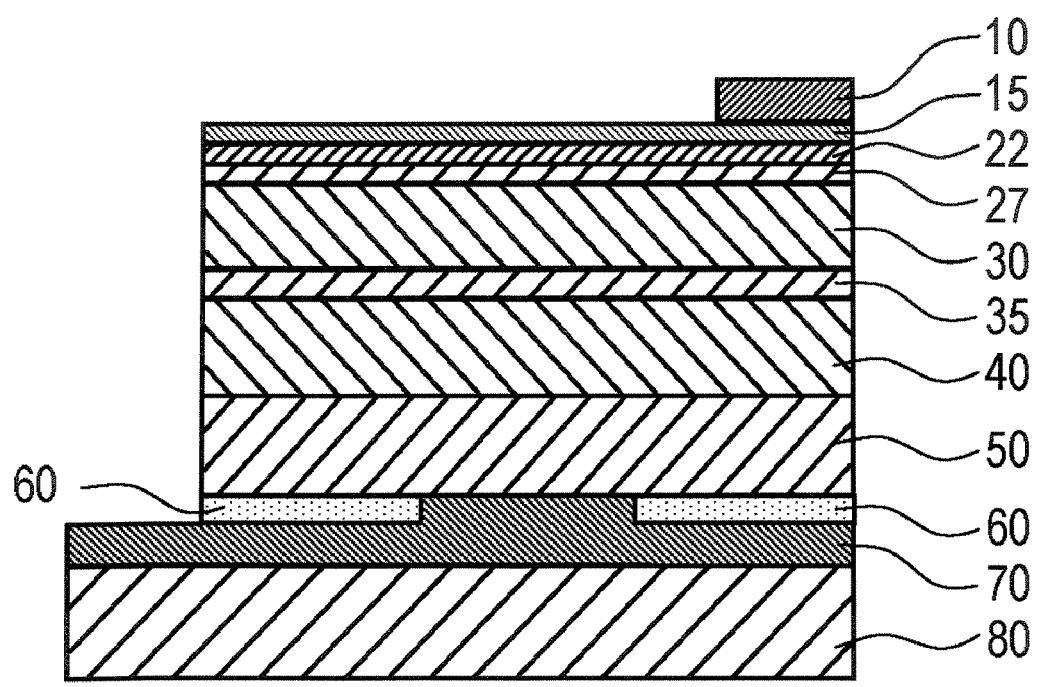
FIG. 1 is a schematic cross section illustrating a light emitting diode according to an embodiment of the invention.

FIG. 1 is a schematic cross section illustrating a light emitting diode according to an embodiment of the invention.

In the light emitting diode of this example, a p-type electrode 70 is laminated on a supporting substrate 80. The p-type electrode 70 is connected to a p-type semiconductor contact layer 50 via part of an insulating layer 60. On the p-type semiconductor contact layer 50, a p-type semiconductor cladding layer 40, an active layer 35, an n-type semiconductor cladding layer 30, an n-type semiconductor contact layer 27, a composition modulation layer 22, and a transparent electrode 15 are laminated in this order. An n-type electrode 10 having a small contact area is provided on the transparent electrode 15.

The n-type semiconductor contact layer 27 and the p-type semiconductor contact layer 50 are provided to decrease contact resistance with the overlying or underlying electrode. The n-type semiconductor cladding layer 30 and the p-type semiconductor cladding layer 40 have a larger bandgap than the active layer 35 and serve to confine injected carriers in the active layer 35. The active layer 35 illustratively has a MQW (multiple quantum well) structure and emits light with a prescribed wavelength by recombination of injected carriers.

Example materials of major portions constituting the light emitting diode according to this embodiment are listed below.

The p-type semiconductor contact layer 50 can be made of gallium arsenide (GaAs) doped with zinc (Zn). The p-type semiconductor cladding layer 40 can be made of p-type aluminum gallium indium phosphide (AlGaInP). The active layer 35 can be made of a MQW structure in which barrier layers of wide bandgap aluminum gallium indium phosphide (AlGaInP) and well layers of narrow bandgap aluminum gallium indium phosphide (AlGaInP) are alternately laminated. The n-type semiconductor cladding layer 30 can be made of n-type aluminum gallium indium phosphide (AlGaInP) compound. The n-type semiconductor contact layer 27 can be made of gallium arsenide (GaAs) doped with silicon (Si). The composition modulation layer 22 can be made of GaAs having a high gallium (Ga) composition ratio. The transparent electrode 15 can be made of indium tin oxide. The n-type electrode 10 and the p-type electrode 70 can be made of gold (Au) based alloy.

When the n-type GaAs contact layer 27 has a film thickness of about 100 nm or less, loss due to light absorption can be reduced. The electrodes can be made of such materials as AuGe alloy and AuZn alloy.

In this example, the transparent electrode 15 is provided to improve light extraction efficiency. The transparent electrode 15 transmits light emission generated in the active layer 35 and emits it upward, while uniformly and efficiently diffusing electrons injected from the n-type electrode 10. In this context, many of the conventionally used transparent electrodes 15 have a higher work function than the n-type semiconductor contact layer 27. Therefore it is difficult to achieve ohmic contact between the transparent electrode 15 and the n-type semiconductor contact layer 27. However, in this example, as described later, a surface treatment is applied to the n-type semiconductor contact layer 27 to form a composition modulation layer 22 sandwiched between the transparent electrode 15 and the n-type semiconductor contact layer 27, thereby achieving good ohmic contact.

Figure 2:
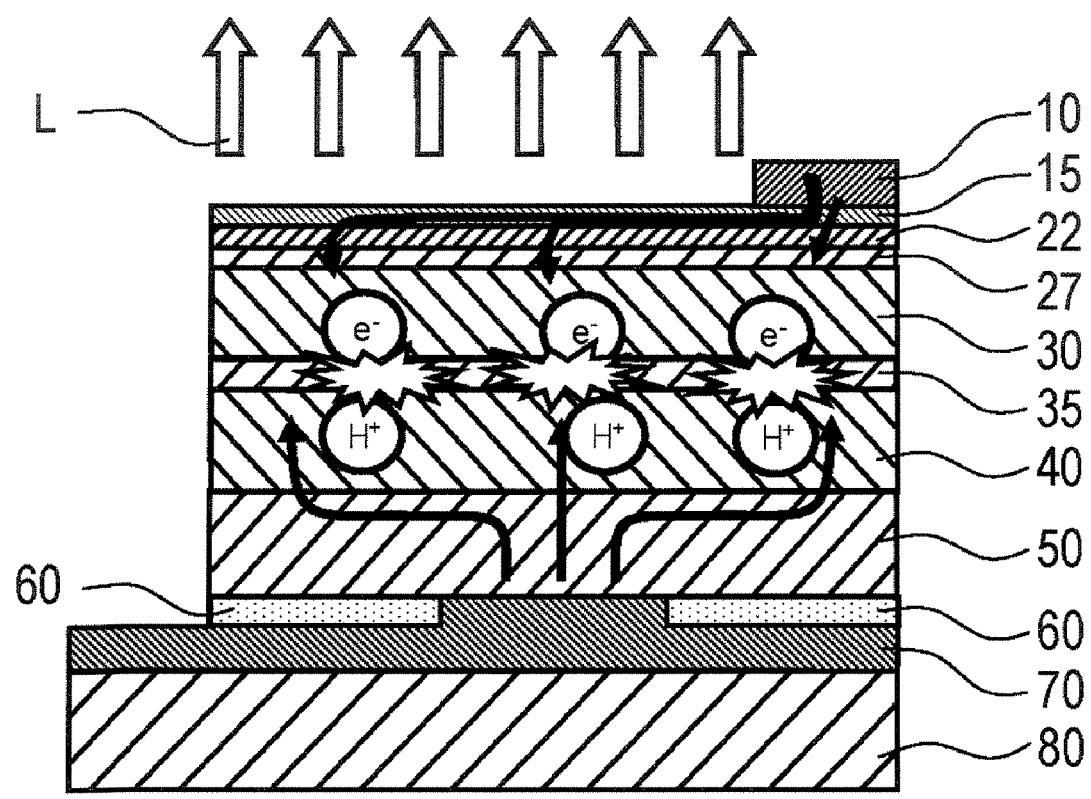
FIG. 2 is a schematic view for illustrating the operation of the example light emitting diode of the invention.

FIG. 2 is a schematic view for illustrating the operation of the light emitting diode of this example.

When a forward bias is applied to the light emitting diode of this example, electrons and holes are injected from the n-side electrode 10 side and from the p-side electrode 70 side, respectively, and recombined in the active layer 35 to generate light emission. According to this example, the composition modulation layer 22 provided between the n-type contact layer 27 and the transparent electrode 15 reduces contact resistance to facilitate injecting electrons from the transparent electrode 15. Light emission L generated in the active layer 35 can be extracted outside with high efficiency via the transparent electrode 15.

Next, a method of manufacturing an ohmic contact of a light emitting diode according to this embodiment is described.

Figure 3:
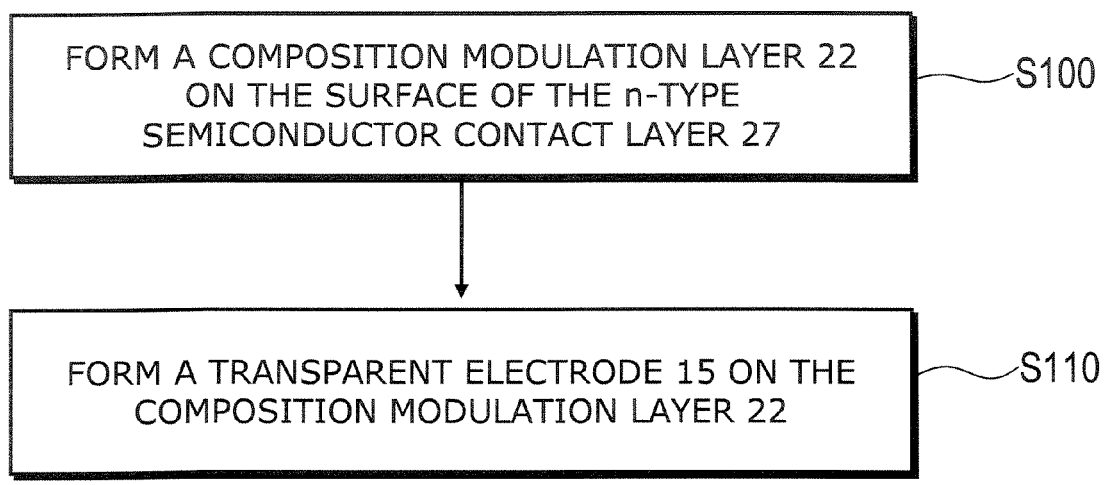
FIG. 3 is a flow chart illustrating a method of forming an ohmic contact of a light emitting diode according to the embodiment of the invention.

FIG. 3 is a flow chart illustrating a method of forming an ohmic contact of a light emitting diode according to this embodiment.

FIG. 4 is a cross-sectional process view illustrating a method of forming an ohmic contact of a light emitting diode that can be used in this embodiment.

Figure 4A:
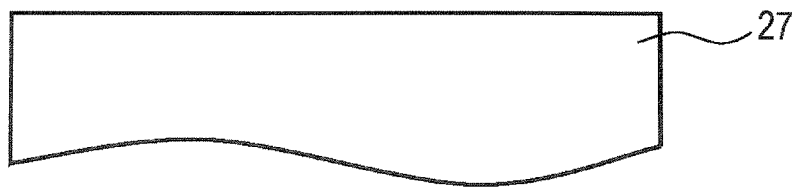
FIG. 4 is a cross-sectional process view illustrating a method of forming an ohmic contact of a light emitting diode that can be used in this embodiment.
Figure 4B:
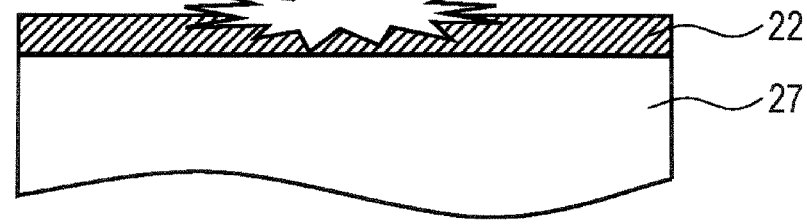

FIG. 4A shows an n-type semiconductor contact layer 27 exposed on the topmost surface of a wafer during the manufacturing process. The surface of the n-type semiconductor contact layer 27 is sputter etched with an inert gas such as argon (Ar). Then, as shown in FIG. 4B, argon atoms or ions 23 collide with the surface of the n-type semiconductor contact layer 27, and arsenic (As) 24 existing on the surface is knocked out, thereby relatively increasing the Ga composition ratio. It is contemplated that this is because arsenic 24 has a higher vapor pressure than gallium and more easily knocked out by sputter etching. Thus a Ga-rich composition modulation layer 22 is formed on the surface of the n-type semiconductor contact layer 27 (step S100).

Figure 4C:
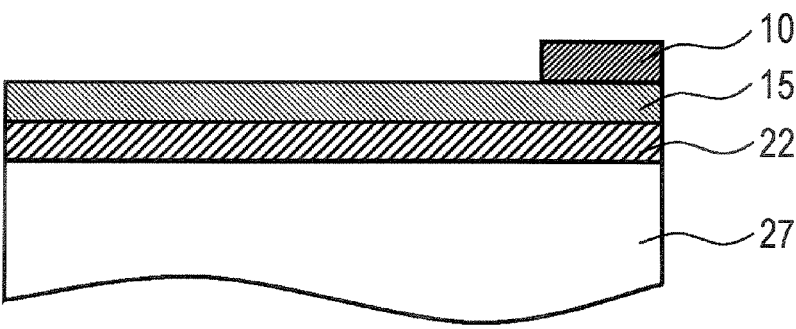

Next, as shown in FIG. 4C, an n-type transparent electrode (ITO) film 15 and an n-type electrode 10 are formed in this order on the Ga-rich composition modulation layer 22 by sputtering or the like (step S110). Here, an inert gas such as helium (He), neon (Ne), argon (Ar), or krypton (Kr) can be used as a reaction gas for sputter etching to reduce generation of byproducts. Among the inert gases, a gas of large atomic weight such as argon or krypton provides a higher sputtering rate.

Figure 5:
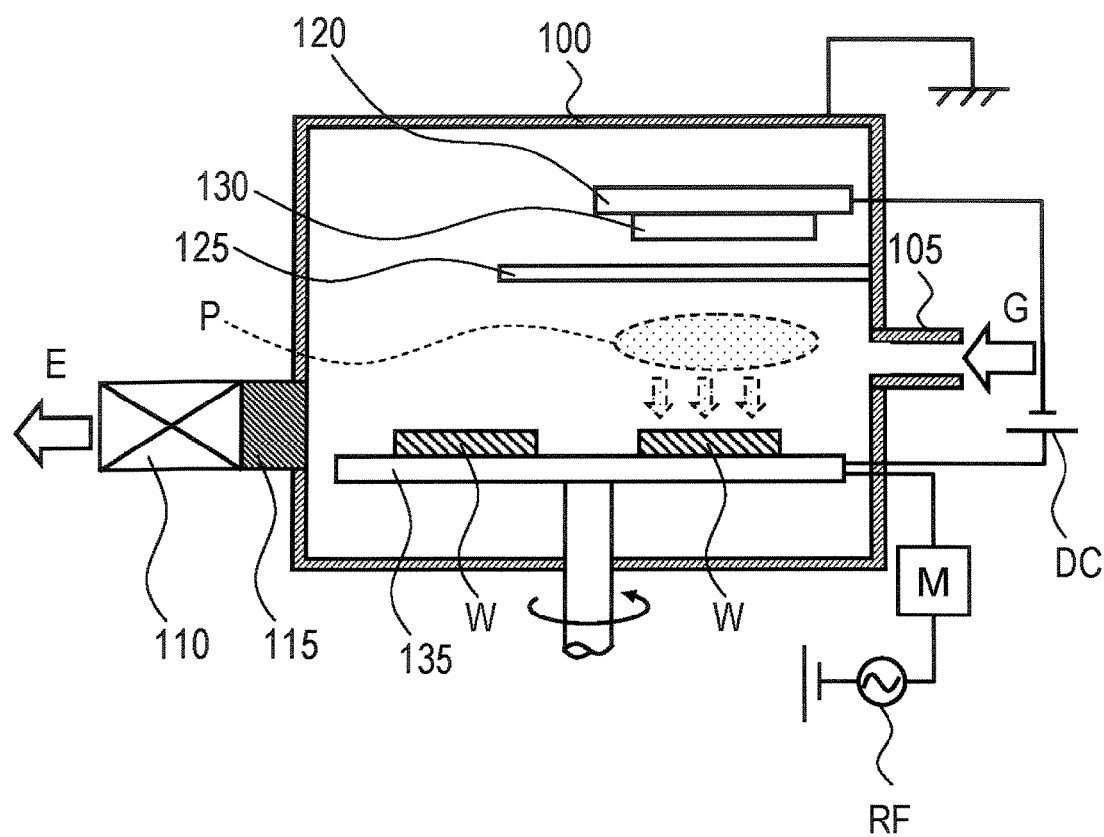
FIG. 5 is a schematic view illustrating an apparatus for manufacturing a light emitting diode that can be used in this embodiment.

FIG. 5 is a schematic view illustrating an apparatus for manufacturing a light emitting diode that can be used in this embodiment.

This manufacturing apparatus can switch sputter etching (reverse sputtering) and sputtering in a continuous manner in the process chamber 100. For example, after a Ga-rich composition modulation layer is formed on the surface of the GaAs layer, an ITO electrode 15 can be formed.

More specifically, this sputtering apparatus has a process chamber 100 and a gas feed pipe 105 communicating with the process chamber 100 through its sidewall A load lock 110 is provided on another sidewall, and a gate 115 is provided between the load lock 110 and the process chamber 100. A carrier gas G for reverse sputtering is fed into the process chamber via the gas feed pipe 105. Transfer of the wafer W into the process chamber 100 and evacuation E are continuously performed via the load lock 110 and the gate 115.

In its upper space, the process chamber 100 includes a target 130 illustratively made of indium tin oxide (ITO) and a target fixing jig 120 which is conductive and serves to fix the target 130. Below the target 130 is provided a shutter 125 that can be controllably opened and closed. For example, closing the shutter 125 during reverse sputtering allows the target 130 to avoid attachment of impurities. Below the shutter 125 is provided a table 135 for single-wafer processing, which can mount a plurality of wafers W and can be controllably rotated. A radio-frequency power supply RF is connected to the table 135 via a matching box M. On the other hand, using the target fixing jig 120 as a cathode and the table 135 as an anode, a direct-current power supply DC is connected between these electrodes and can be used for biasing.

Figure 6A:
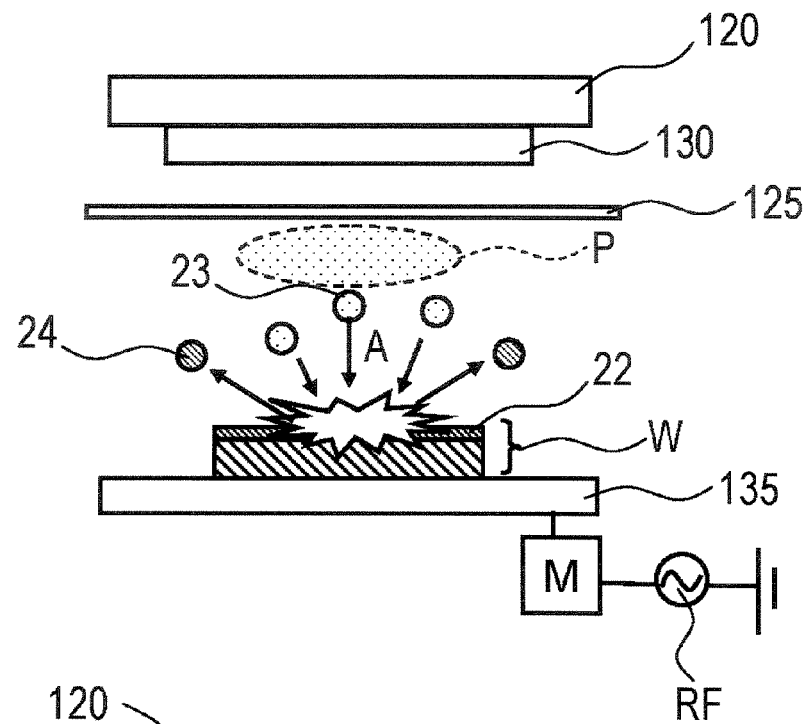
FIGS. 6A and 6B are process cross-sectional views illustrating a sputter etching process (FIG. 6A) and a sputtering process (FIG. 6B) performed by the manufacturing apparatus of FIG. 5.
Figure 6B:
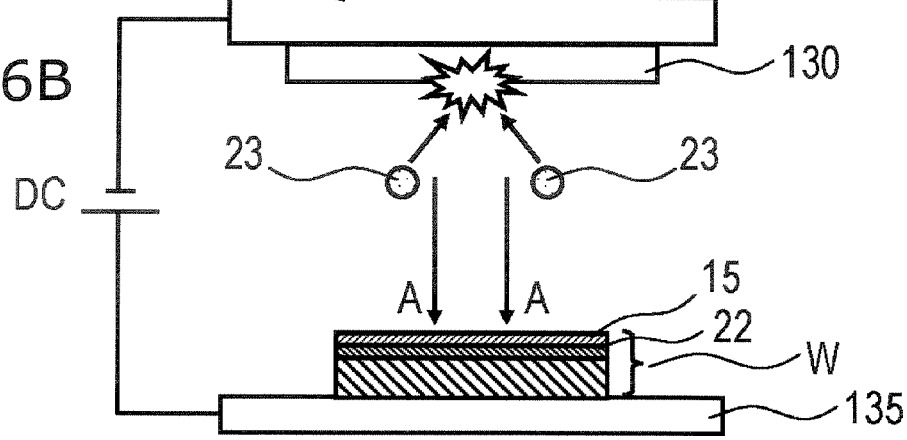

FIGS. 6A and 6B are process cross-sectional views illustrating a sputter etching process (FIG. 6A) and a sputtering process (FIG. 6B) performed by the manufacturing apparatus described above with reference to FIG. 5.

As shown in FIG. 6A, the process of sputter etching a wafer W begins by transferring the wafer W from the load lock 110 into the process chamber 100 via the gate 115. Then, while feeding a sputter etching gas such as argon (Ar) gas via the gas feed pipe 105 into the process chamber 100, radio-frequency wave of 13.56 MHz, for example, is applied to the table 135 to form a plasma P between the wafer W and the shutter 125, where the shutter 125 is closed.

Argon ions ($Ar^+$) 23 formed by the plasma P collide with the surface of the n-type GaAs contact layer 27 on the wafer W. Arsenic 24 on the surface of the wafer W is knocked out, and a Ga-rich composition modulation layer 22 is formed.

Next, in the sputtering process, as shown in FIG. 6B, the shutter 125 (not shown) is opened, and a DC voltage is applied between the target fixing jig 120 and the table 135. Argon ions ($Ar^+$) 23 generated between the electrodes are accelerated near the ITO target 130, collide with the surface of the ITO target 130, and knock out ITO atoms. The sputtered ITO particles are deposited on the Ga-rich composition modulation layer 22 on the surface of the wafer W to form an ITO electrode 15. At this time, oxygen gas or oxygen-containing gas may also be fed into the process chamber 100 to adjust the oxygen content of the ITO electrode 15.

By using this manufacturing apparatus, a Ga-rich composition modulation layer 22 for improving ohmic contact and an ITO electrode 15 are laminated on the n-type GaAs contact layer 27 in a continuous manner.

Here, after the Ga-rich composition modulation layer 22 is formed on the wafer W, if the vacuum were broken and the chamber were evacuated again for film growth of the ITO electrode 15, then the Ga-rich composition modulation layer 22 would be oxidized. This may lead to poor ohmic contact. In contrast, according to this example, the composition modulation layer 22 and the transparent electrode 15 can be formed without breaking the vacuum. Therefore good ohmic contact can be formed.

Figure 7:
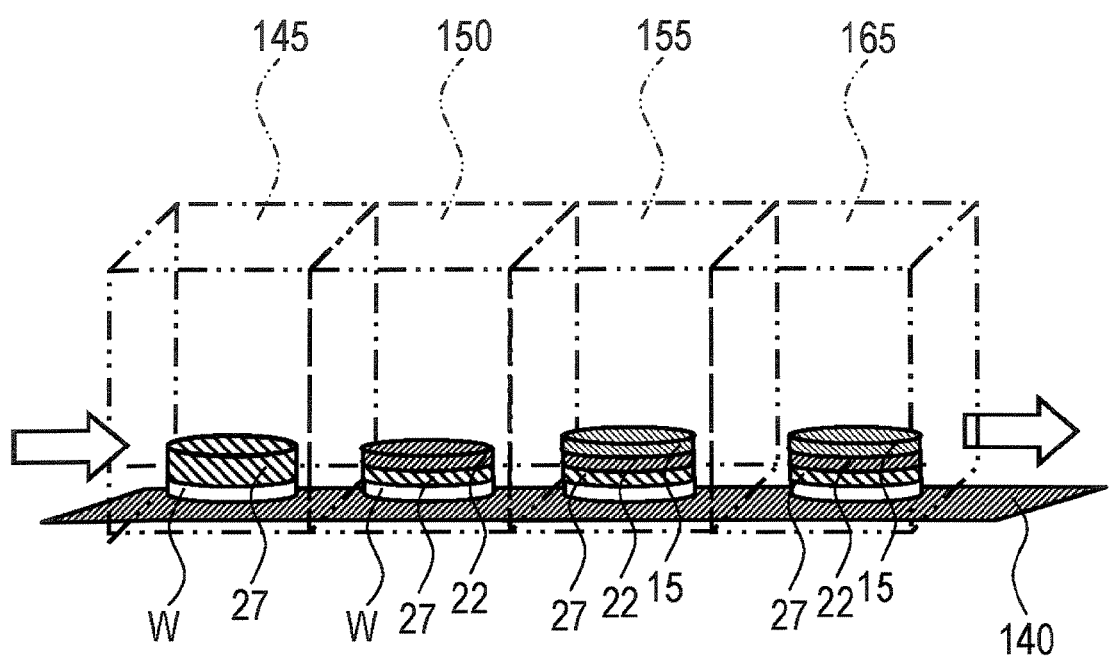
FIG. 7 is a schematic view showing another example of the apparatus for manufacturing a light emitting diode that can be used in this embodiment.

FIG. 7 is a schematic view showing another example of the apparatus for manufacturing a light emitting diode that can be used in this embodiment.

This example is based on the so-called "in-line" configuration to allow the sputter etching process and the sputtering process to be continuously performed. More specifically, as shown in this figure, a gas replacement chamber 145 filled with a sputter etching gas, a reverse sputtering chamber 150, a sputtering chamber 155, and an electrode formation chamber 165 are linked in this order. Inside these chambers, they can communicate with each other via gate valves and the like (not shown) as appropriate. Each chamber is provided with a gas feed pipe 105 (not shown) and maintained at a prescribed pressure. The wafer W is transferred using a transfer belt 140.

The processing operation by the manufacturing apparatus of this example begins by transferring the wafer W via the gas replacement chamber 145 into the sputter etching chamber 150, the wafer W being provided with an n-type GaAs contact layer 27 on the topmost surface thereof. In the sputter etching chamber 150, the sputter etching process similar to that described above with reference to FIG. 6A is performed to form a composition modulation layer 22 on the surface of the n-type GaAs contact layer 27. Next, after transferring the wafer W into the sputtering chamber 155, the process similar to that described above with reference to FIG. 6B can be performed to form an ITO electrode 15 on the composition modulation layer 22. Subsequently, an n-side electrode 10 can be formed in the electrode formation chamber 165.

By using such an in-line manufacturing apparatus, the layers can be formed without breaking the vacuum. In particular, oxidation of the composition modulation layer 22 can be prevented to form good ohmic contact.

The foregoing has described a light emitting diode and a method of manufacturing the same according to this embodiment.

Next, experiments conducted by the inventor will be described.

The inventor considered that the surface state of the composition modulation layer 22 significantly affects the ohmic contact property and studied the relationship between the formation condition and the surface state of the composition modulation layer.

Figure 8:
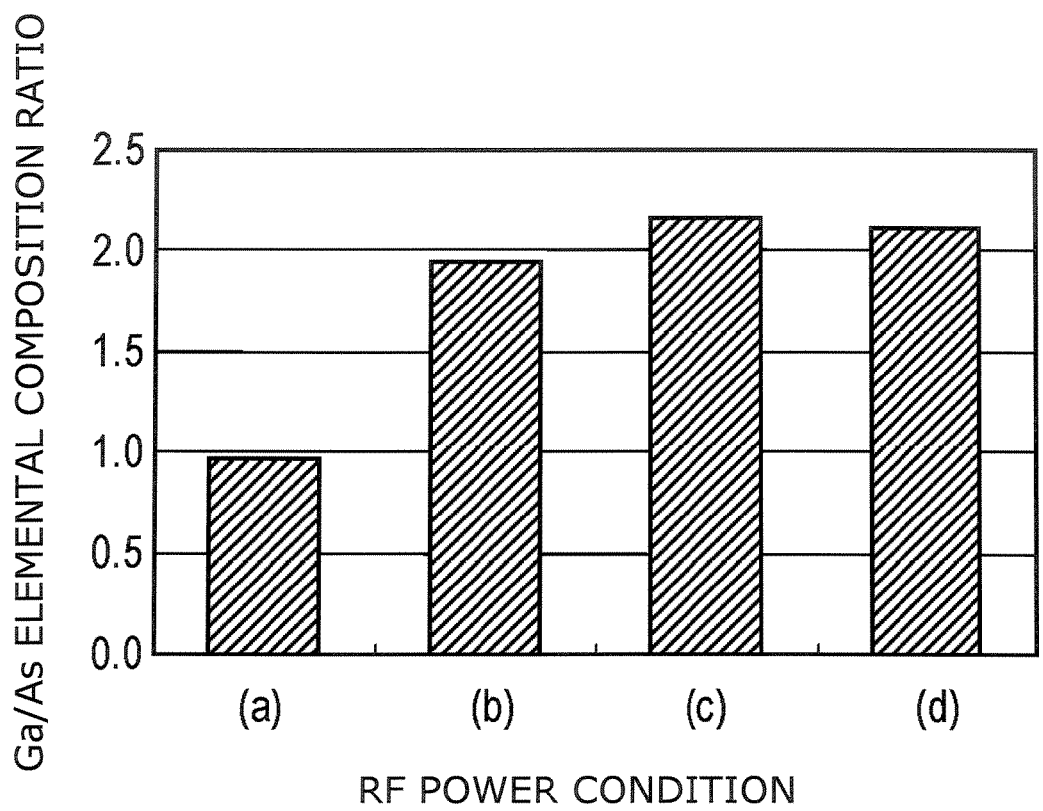
FIG. 8 is a graphical diagram showing the variation of elemental composition ratio for different RF power conditions of the sputter etching process.

FIG. 8 is a graphical diagram showing the variation of elemental composition ratio for different RF power conditions of the sputter etching process. This figure shows the Ga/As elemental composition ratio of the n-type GaAs contact layer 27 surface subjected to sputter etching under the conditions of (a) without processing, (b) at 100 W for 1 minute, (c) at 100 W for 2 minutes, and (d) at 200 W for 1 minute. The Ga/As elemental composition ratio is calculated from the intensity ratio obtained by X-ray photoelectron spectroscopy (XPS).

As shown in this figure, in the case of no sputter etching (a), the Ga/As elemental composition ratio of the n-type GaAs contact layer 27 surface is 0.97, indicating the existence of a comparable amount of Ga and As elements. In contrast, in the case of sputtering under all the other conditions, the Ga/As elemental composition ratio becomes 1.95 or more. Thus the existence ratio of Ga element is about twice as high as that of As element, indicating that a Ga-rich layer is formed.

More specifically, in the case of RF voltage applied at 100 W for 1 minute (condition (b)), the Ga—As/Ga—O bond peak intensity ratio is 0.38 (etching rate: 51.3 nm/min). On the other hand, the peak intensity ratio is 0.48 for RF voltage applied at 100 W for 2 minutes (condition (c)), and 0.53 (etching rate: 109.3 nm/min) for RF voltage applied at 200 W for 1 minute (condition (d)). This result suggests that the film thickness of the composition modulation layer 22 formed by sputter etching depends on the amount of etching.

FIG. 9 is a graphical diagram showing an XPS spectrum for the 3d orbital of As atoms existing on the surface of the n-type GaAs contact layer 27. Here again, the figure shows the result under the sputter etching conditions of (a) without sputter etching, (b) at 100 W for 1 minute, (c) at 100 W for 2 minutes, and (d) at 200 W for 1 minute.

Figure 9A:
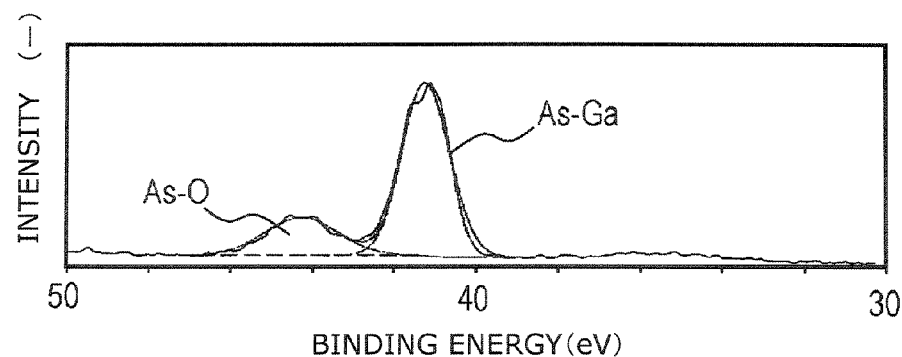
FIG. 9 is a graphical diagram showing an XPS spectrum for the 3d orbital of As atoms existing on the surface of the n-type GaAs contact layer 27.
Figure 9B:
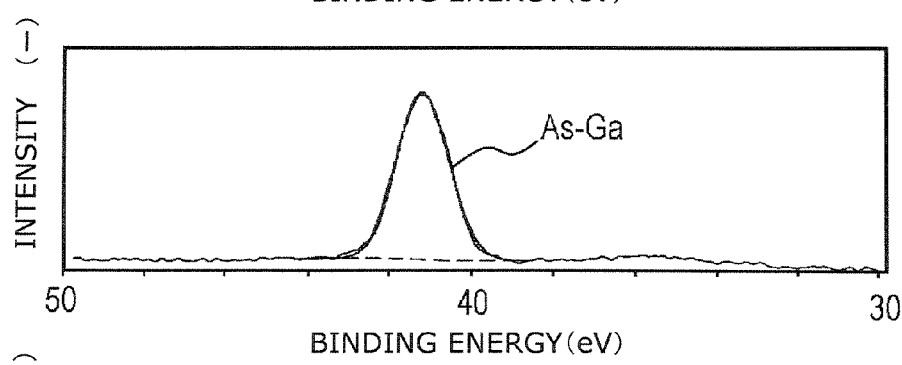
Figure 9C:
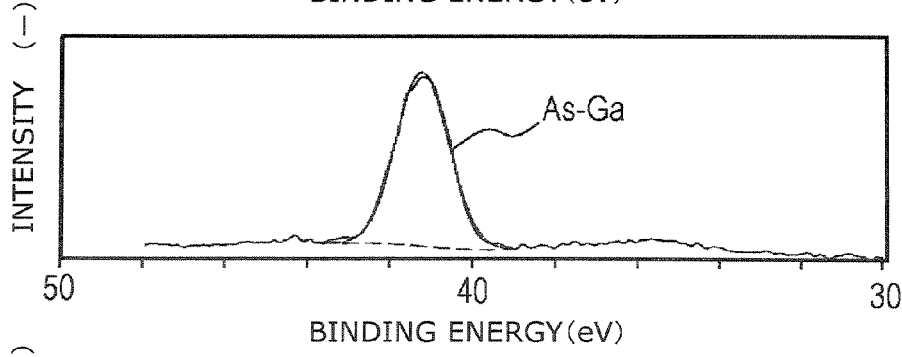
Figure 9D:
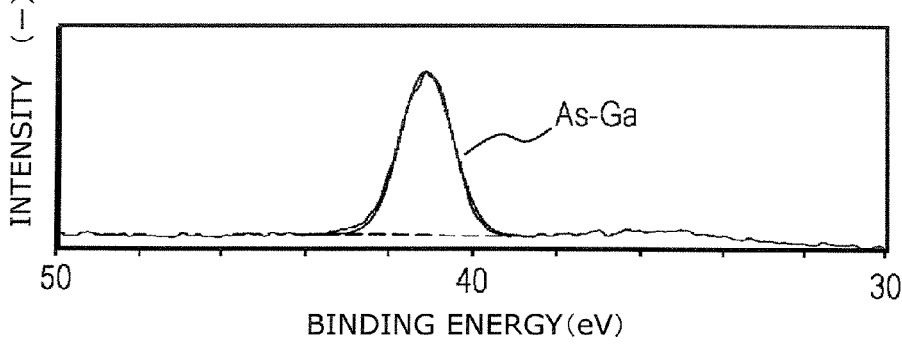
Figure 10A:
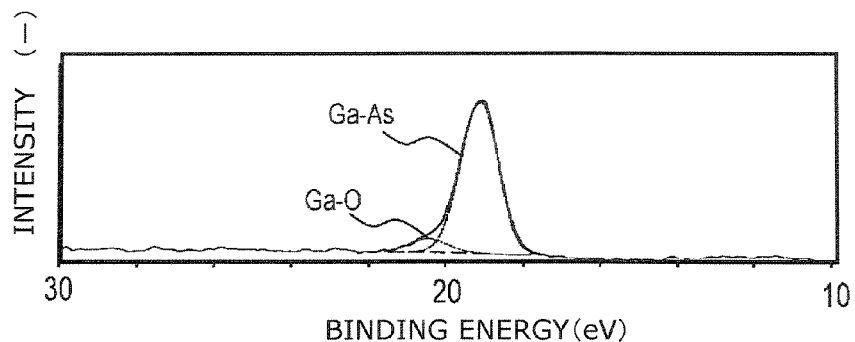
FIG. 10 is a graphical diagram showing a spectrum for the 3d orbital of Ga atoms existing on the surface of the n-type GaAs contact layer 27.
Figure 10B:
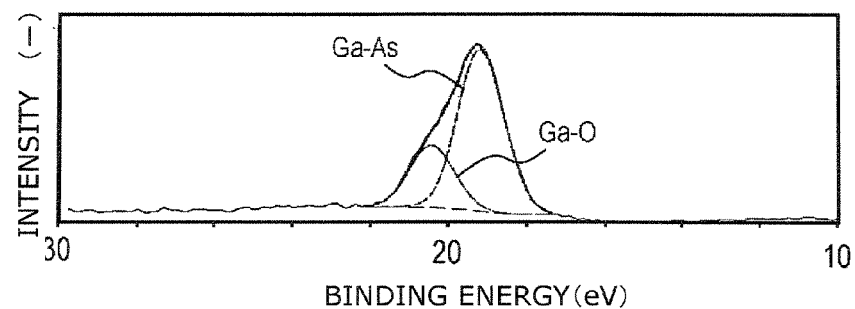
Figure 10C:
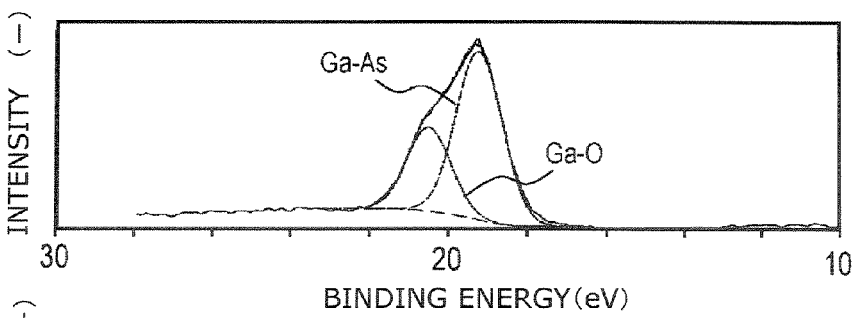
Figure 10D:
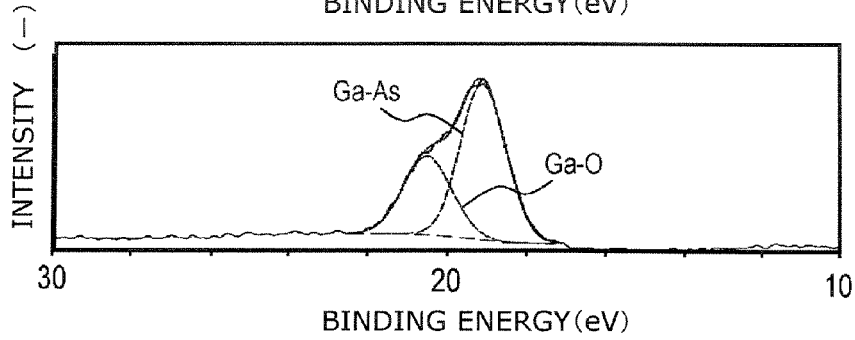

As shown in FIG. 9A, two peaks are identified on the surface of the n-type GaAs contact layer 27 without sputter etching: the bond peak of As and Ga elements (As—Ga) and the bond peak of As and oxygen (O) elements (As—O). In contrast, under all the other RF conditions, the As—Ga bond has a significantly higher peak than the As—O bond. This indicates that no As oxides exist on the surface of the n-type GaAs contact layer 27 subjected to sputter etching under the RF conditions (c) to (d).

FIG. 10 is a graphical diagram showing a spectrum for the 3d orbital of Ga atoms existing on the surface of the n-type GaAs contact layer 27. Here again, the figure shows the result under the sputter etching conditions of (a) without sputter etching, (b) at 100 W for 1 minute, (c) at 100 W for 2 minutes, and (d) at 200 W for 1 minute.

Under all the RF power conditions, the Ga—As bond and the Ga—O bond are identified. In particular, the peak intensity of the Ga—O bond under the RF conditions (b) to (d) exhibits a significantly higher value than under the condition (a). Appearance of the Ga—O bond is presumably because, after the sputter etching process, XPS analysis was performed on the sample extracted into the atmosphere and oxygen was bound to the sample surface. In view of the result that the peak intensity of the Ga—O bond for (b) to (d) is significantly higher than for (a), it is inferred that the sputter etching process increases the Ga composition ratio on the surface of the n-type GaAs contact layer 27 and simultaneously activates the surface, thereby facilitating bonding of oxygen.

Next, a description is given of electric characteristics of a sample on which a composition modulation layer is formed.

Figure 11:
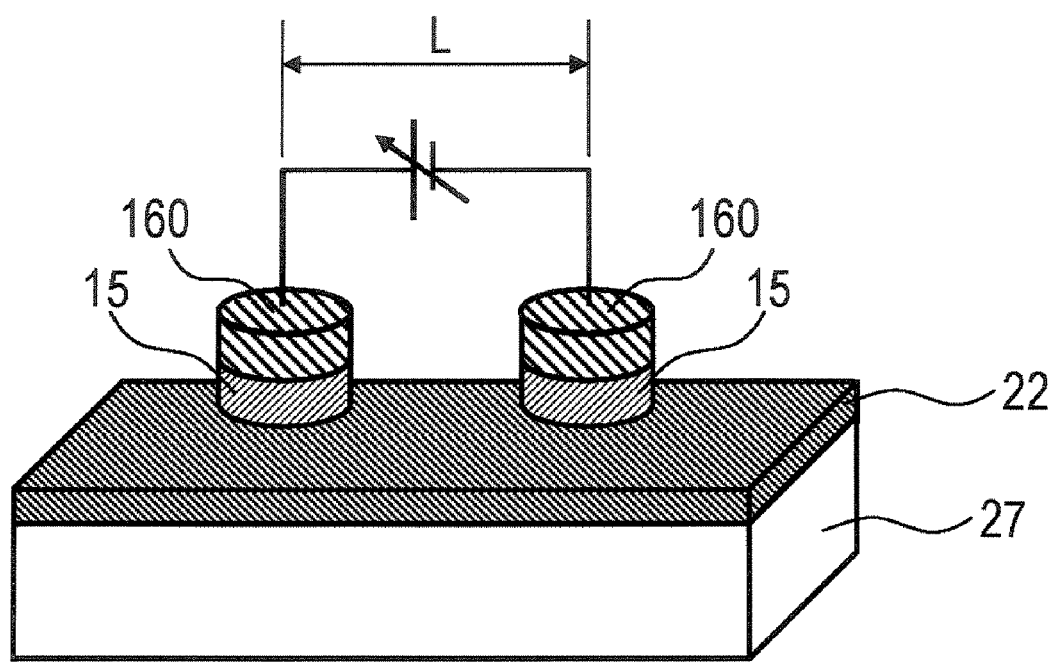
FIG. 11 is a schematic view illustrating a characterization sample used for electric characterization of the light emitting diode according to this embodiment.

FIG. 11 is a schematic view illustrating a characterization sample used for electric characterization of the light emitting diode according to this embodiment.

For electric characterization of a laminated body having a composition modulation layer 22 sandwiched between the transparent electrode 15 and the GaAs contact layer 27, as shown in FIG. 11, two electrodes were formed by laminating an ITO electrode 15 and an n-side electrode (e.g., molybdenum electrode) 160. The spacing L between the electrodes is 1 millimeter, and the diameter of each electrode is also 1 millimeter.

The method of forming this characterization sample is as follows.

The n-type GaAs contact layer 27 is formed by MOCVD (Metal Organic Chemical Vapor Deposition), where it is epitaxially grown while being doped with silicon (Si) at a doping amount of $1 \times 10^{18}$ cm$^{-3}$.

Subsequently, the surface is washed with a buffered hydrofluoric acid aqueous solution (HF 6%, NH$_4$F 30%), and sputter etched to form a composition modulation layer 22. The sputter etching is performed at room temperature under the following condition: degree of vacuum $1 \times 10^{-5}$ Pa, Ar gas flow rate 30 sccm, etching gas pressure 0.67 Pa, and RF frequency 13.56 MHz. Then, on the surface of the composition modulation layer 22, an ITO electrode 15 is deposited by sputtering. Here, an ITO electrode 15 with a film thickness of 100 nanometers is formed under the following condition: degree of vacuum $1 \times 10^{-5}$ Pa, Ar gas flow rate 30 sccm, O$_2$ gas flow rate 0.5 sccm, sputtering gas pressure 0.67 Pa, DC discharge power 100 W, and discharge voltage −270 V. The ITO electrode 15 is patterned by wet etching.

Figure 12:
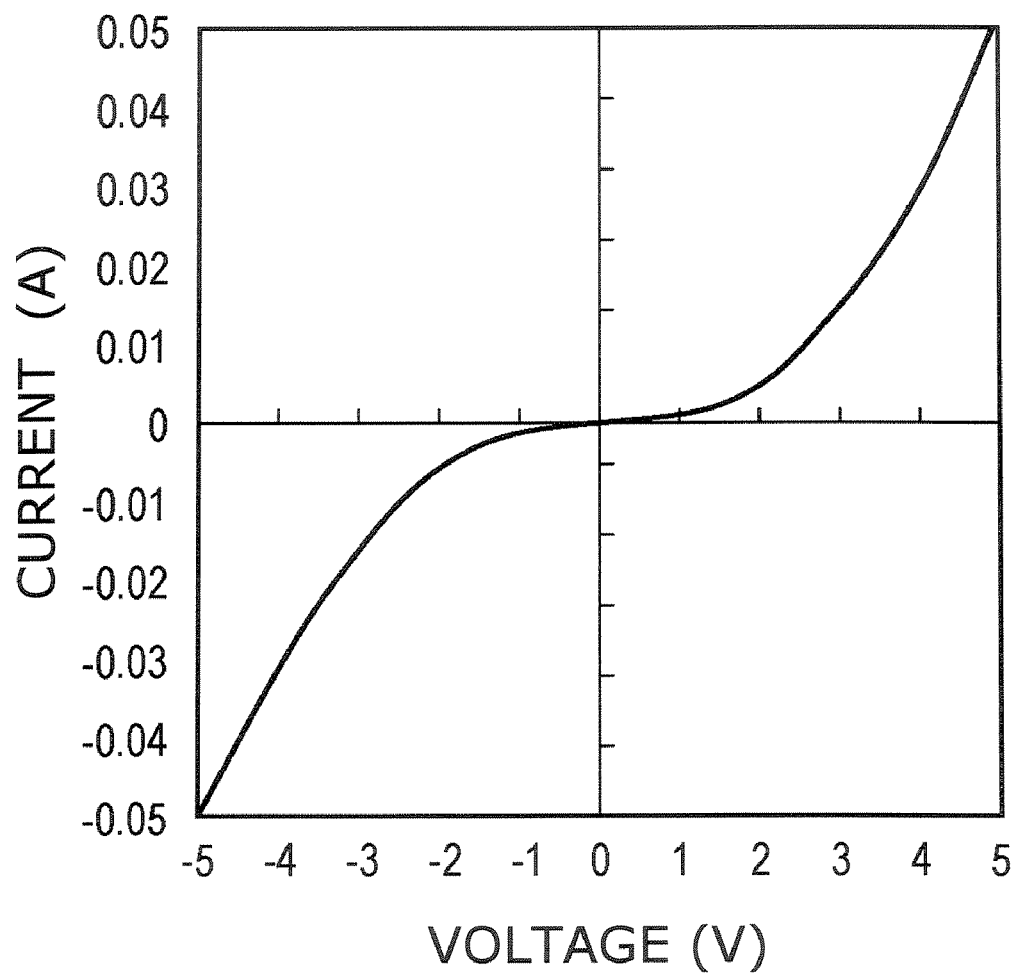
FIG. 12 is a schematic diagram illustrating the current-voltage characteristic of a characterization sample of a comparative example.

FIG. 12 is a schematic diagram illustrating the current-voltage characteristic of a characterization sample of a comparative example.

In this comparative example, an ITO electrode 15 is formed on the n-type GaAs contact layer 27 without forming the composition modulation layer 22. The resulting current-voltage characteristic is nonlinear, failing to obtain ohmic contact. It is contemplated that, as described earlier, this is because the work function of the ITO electrode 15 is as high as 4.7 eV or more.

Figure 13:
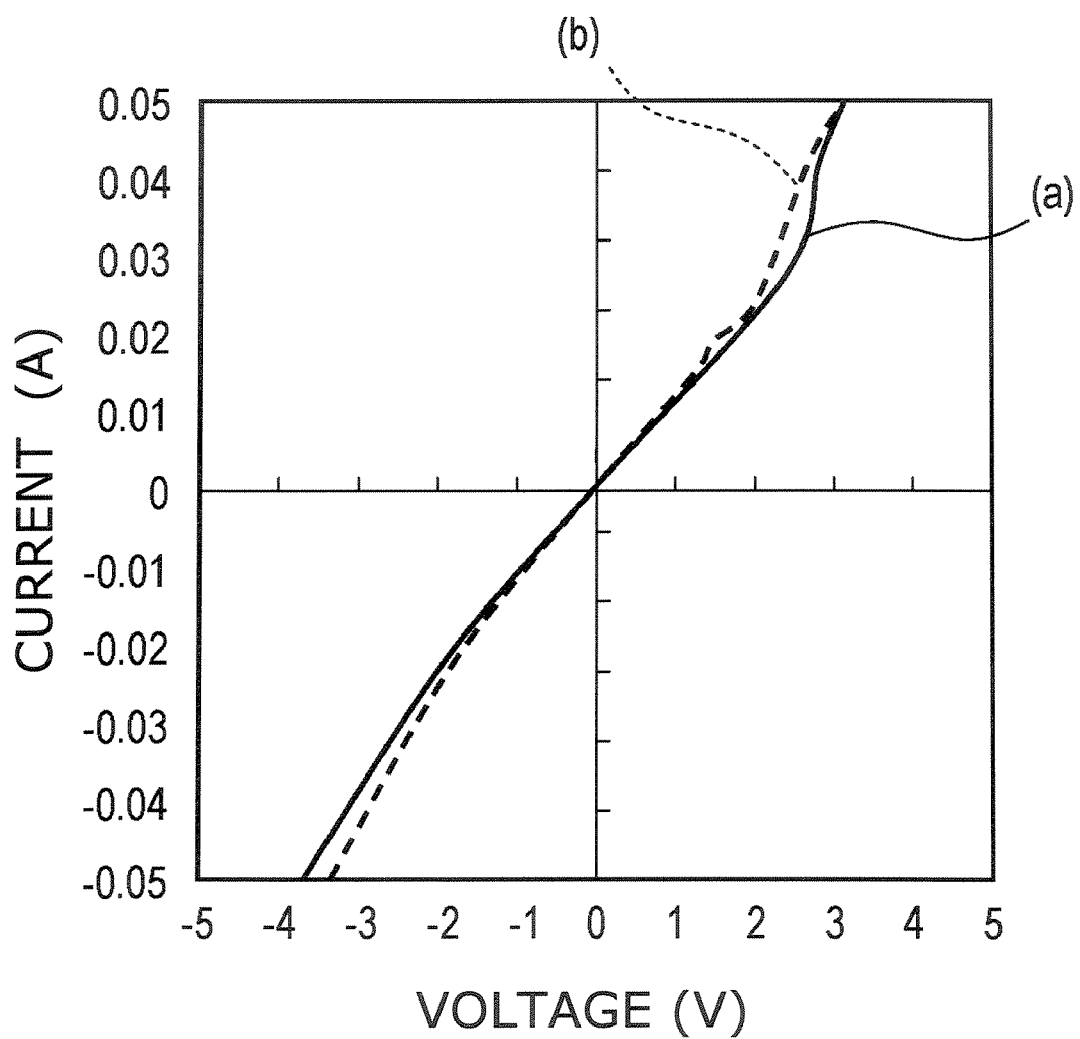
FIG. 13 is a graphical diagram showing the current-voltage characteristic of a characterization sample of a comparative example in which an ITO electrode is laminated on the p-type GaAs.

FIG. 13 is a graphical diagram showing the current-voltage characteristic of a characterization sample of a comparative example in which an ITO electrode 15 is laminated on the p-type GaAs.

The p-type GaAs contact layer is grown by MOCVD while being doped with carbon (C) at (a) $6 \times 10^{19}$ cm$^{-3}$ or (b) $1 \times 10^{20}$ cm$^{-3}$. As shown in FIG. 13, in the case of p-type GaAs, the current-voltage characteristic is nearly linear for both doping amounts of carbon, indicating that a characteristic close to ohmic contact can be achieved. It is contemplated that this is because the carrier concentration of the p-type GaAs contact layer 50 can be increased up to the order of $10^{20}$, giving a work function comparable to that of the ITO electrode 15.

Figure 14:
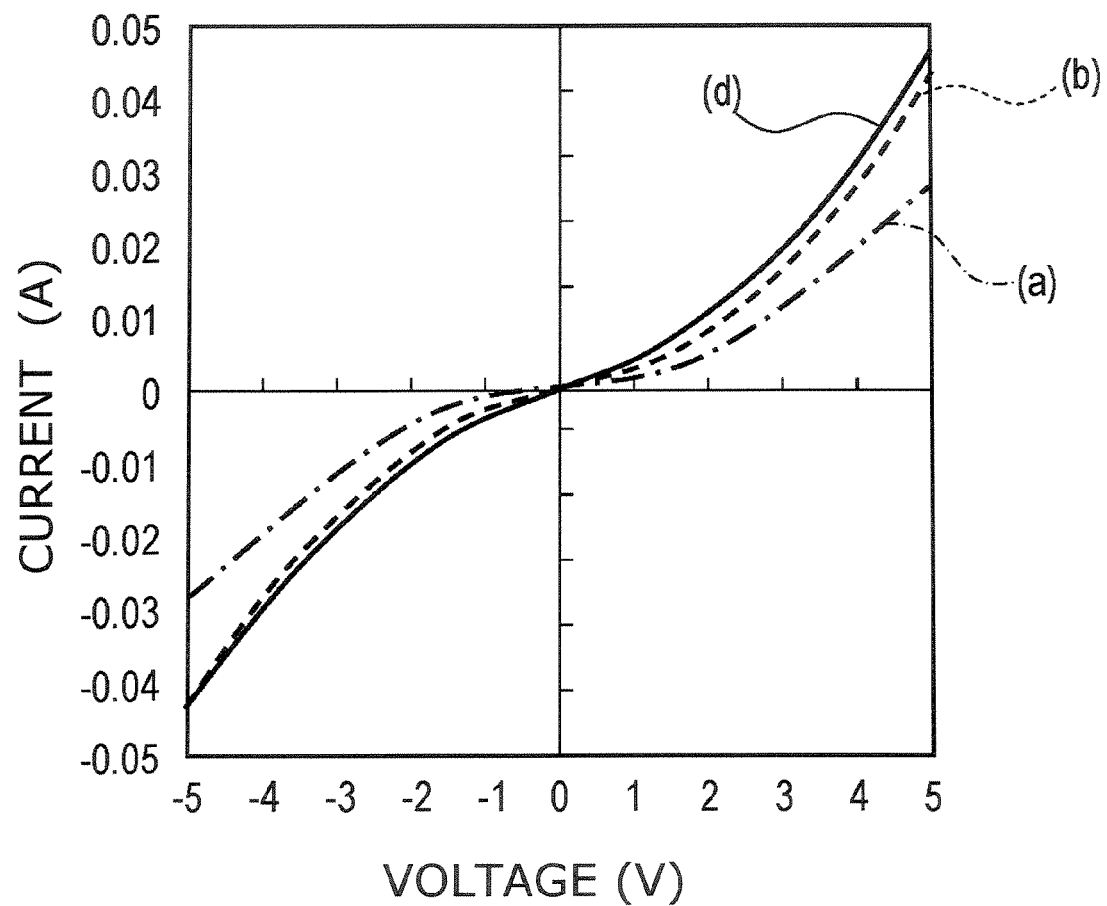
FIG. 14 is a graphical diagram showing the effect of a composition modulation layer provided on the n-type GaAs contact layer.

FIG. 14 is a graphical diagram showing the effect of a composition modulation layer provided on the n-type GaAs contact layer.

The horizontal axis represents voltage (V), and the vertical axis represents current (A). The RF power conditions for forming the composition modulation layer 22 are similar to those described above with reference to FIGS. 8 to 10, taking the following three conditions: (a) without processing, (b) at 100 W for 1 minute, and (d) at 200 W for 1 minute. The measurement was made at room temperature.

The result is as shown in FIG. 14. For a laminated body formed without applying RF power (a), the current-voltage characteristic has large nonlinearity, allowing little current to flow in the voltage range of −1 to +1 volt. In contrast, for a laminated body in which the composition modulation layer 22 is formed by applying RF power at 100 W for 1 minute (b) and at 200 W for 1 minute (d), the current increases in the range of −1 to +1 volt, exhibiting a tendency of the current-voltage curve to become linear. Comparing the case of applying RF power at 100 W for 1 minute (b) with the case at 200 W for 1 minute (d), the case of condition (d) is found to be more linear. This presumably reflects the different film thicknesses of the composition modulation layer 22 as described above with reference to FIGS. 8 to 10.

Figure 15:
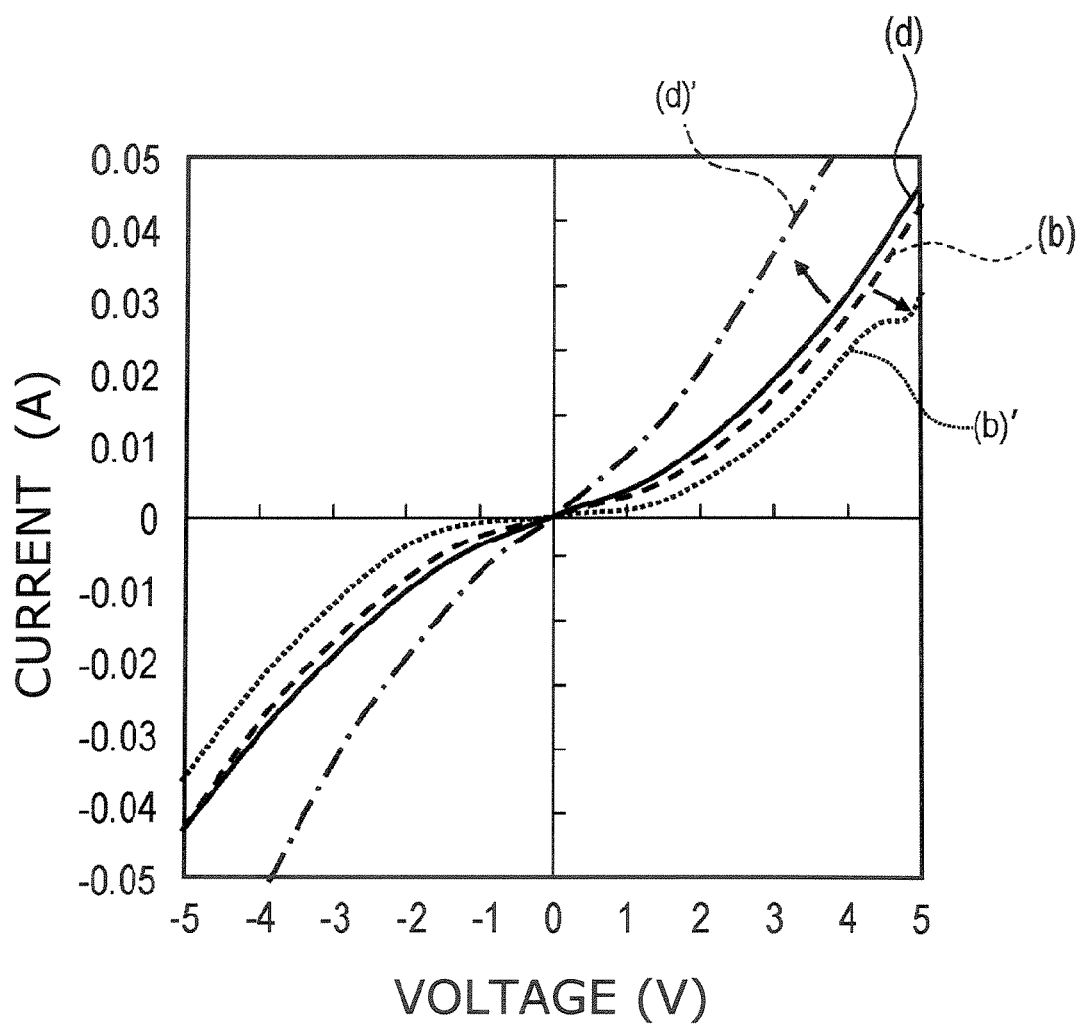
FIG. 15 is a graphical diagram showing the variation of characteristics due to heat treatment of the sample described above with reference to FIG. 14.

FIG. 15 is a graphical diagram showing the variation of characteristics due to heat treatment of the sample described above with reference to FIG. 14.

More specifically, the samples (b) and (d) described above with reference to FIG. 14 were heat treated in a 500 Pa nitrogen atmosphere at 450° C. for 1 minute. As shown in FIG. 15, the sample (d)′, which was obtained by heat treating the sample (d) prepared under the RF power condition of 200 W for 1 minute (d), has an improved ohmic contact. It is contemplated that this is because the heat treatment lowers the barrier between the composition modulation layer 22 and the ITO electrode 15 and decreases contact resistance.

On the other hand, with regard to the sample (b)′, which was obtained by heat treating the sample (b) prepared under the RF power condition of 100 W for 1 minute (b), the current is decreased, and ohmic contact is deteriorated. It is contemplated that this is because the effect of oxidation by heat treatment is enhanced when the thickness of the composition modulation layer 22 formed on the surface of the n-type GaAs contact layer 27 is small.

Figure 16:
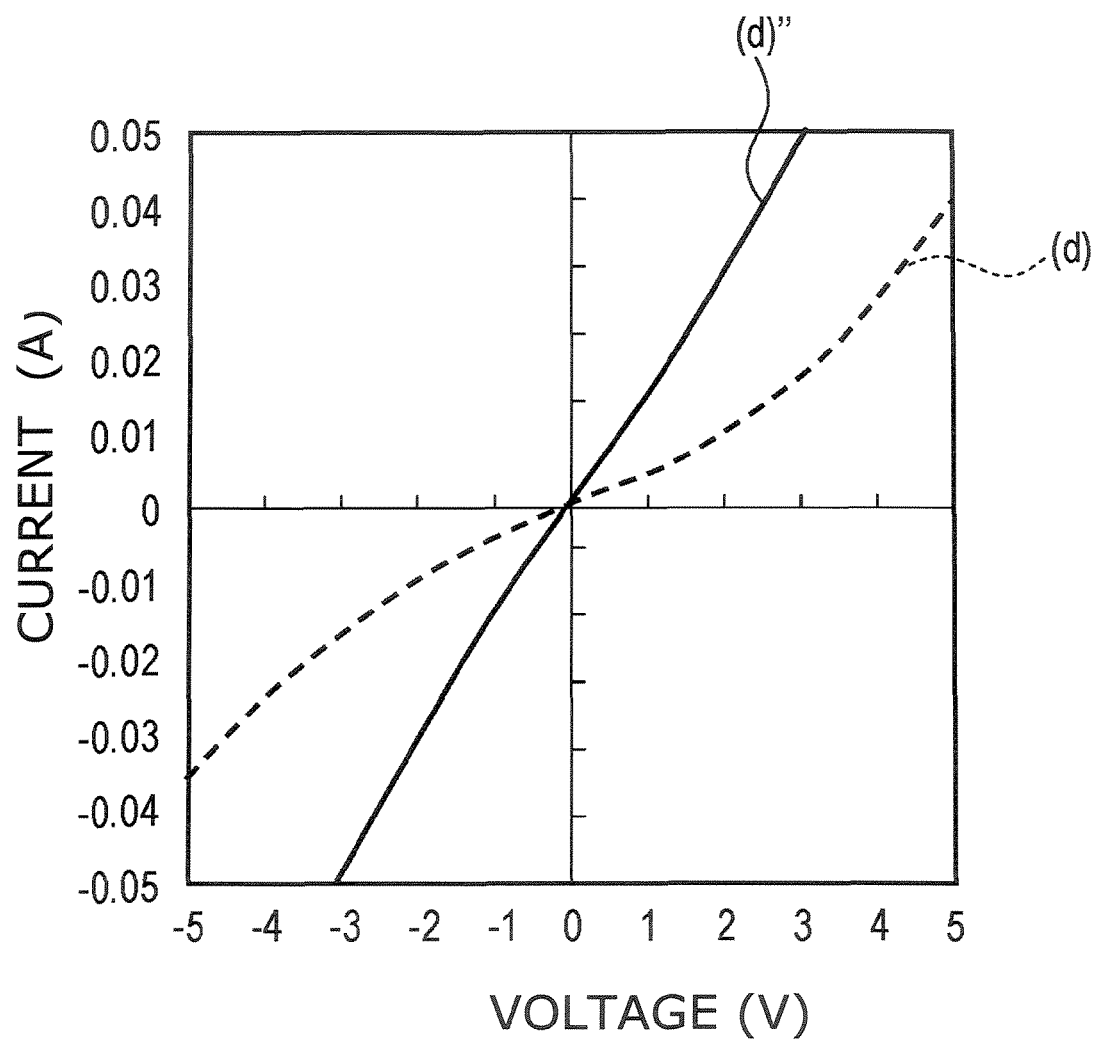
FIG. 16 is a graphical diagram showing the effect of heating the substrate during ITO film growth.

FIG. 16 is a graphical diagram showing the effect of heating the substrate during film growth of the ITO electrode 15. More specifically, this figure shows the current-voltage characteristics of the sample (d) in which the composition modulation layer 22 is formed under the RF power condition of 200 W for 1 minute and then the ITO electrode 15 is formed at room temperature, and a sample (d)″ in which the ITO electrode 15 is formed while being heated at 250° C.

As can be seen, the sample (d)″ in which the ITO electrode 15 is formed while being heated at 250° C. has higher linearity in the current-voltage characteristic and allows higher current than the sample (d) in which the ITO electrode 15 is formed at room temperature. It is contemplated that this is because the progress of crystallization of the ITO electrode 15 decreases the resistance of the ITO electrode 15 and also decreases contact resistance between the composition modulation layer 22 and the ITO electrode 15.

As described above, according to this embodiment, sandwiching a composition modulation layer 22 between the n-type GaAs contact layer 27 and the ITO electrode 15 provides a good ohmic contact, and light can be extracted via the ITO electrode 15 with high efficiency.

Furthermore, the contact resistance can be further reduced by adjusting the sputter etching condition for the n-type GaAs contact layer 27 in forming the composition modulation layer 22, by applying heat treatment after forming the ITO electrode 15, and by increasing the film growth temperature for the ITO electrode 15.

The foregoing has described a light emitting diode according to the embodiment of the invention with reference to the characteristics of characterization samples.

Next, a description is given of the ITO electrode 15 that can be provided in the light emitting diode according to the embodiment of the invention.

Figure 17:
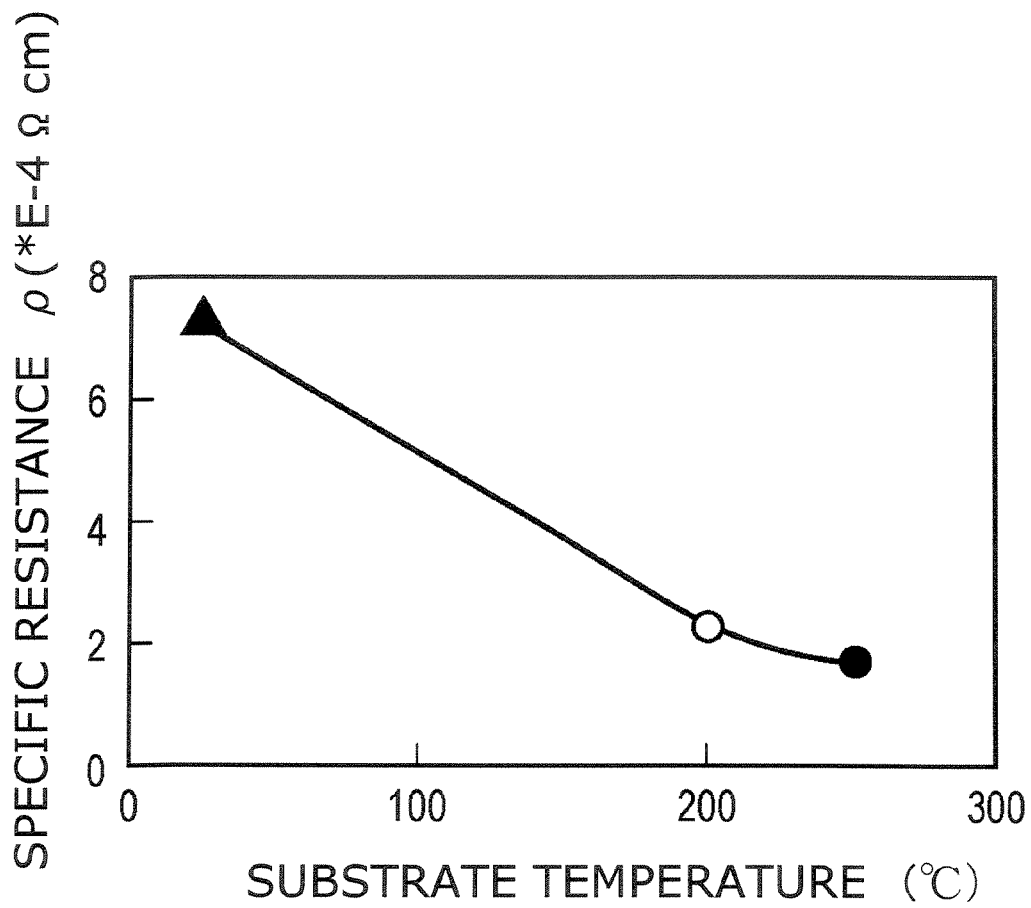
FIG. 17 is a graphical diagram showing the relationship between the substrate temperature and the specific resistance during film growth of the ITO electrode 15.

FIG. 17 is a graphical diagram showing the relationship between the substrate temperature and the specific resistance during film growth of the ITO electrode 15. A sample having an ITO electrode 15 on a glass substrate was prepared, and the specific resistance of the ITO electrode 15 was measured at room temperature by the four-probe method. The ITO electrode 15 was formed using a magnetron sputtering system (ULVAC CS-200). The specific resistance becomes lower as the discharge voltage during sputtering decreases. Thus a high field magnet (target surface field of about 1000 G) operable at low discharge voltage was installed on the cathode, and film growth was performed by the magnetron sputtering method. Furthermore, the specific resistance of the ITO electrode 15 is also affected by oxygen supply during sputtering. Therefore an optimal amount of oxygen supply is determined in advance so as to achieve low specific resistance.

The sputtering condition is as follows: degree of vacuum $1\times10^{-5}$ Pa, Ar gas flow rate 30 sccm, $O_2$ gas supply 0.5 sccm, sputtering pressure 0.67 Pa, DC discharge power 100 W, and discharge voltage −270 V. The sputtering target is a sintered target made of 90 wt % $In_2O_3$/10 wt % $SnO_2$. Three substrate temperatures are used during film growth: (I) room temperature, (II) 200° C., and (III) 250° C. In each case, the formed ITO electrode 15 has a film thickness of about 100 nanometers.

As shown in FIG. 17, the specific resistance of the ITO electrode 15 decreases as the substrate temperature during formation increases. For example, when the substrate temperature is (III) 250° C., a contact resistance of $1.7\times10^{-4}$ Ωcm was obtained.

Figure 18:
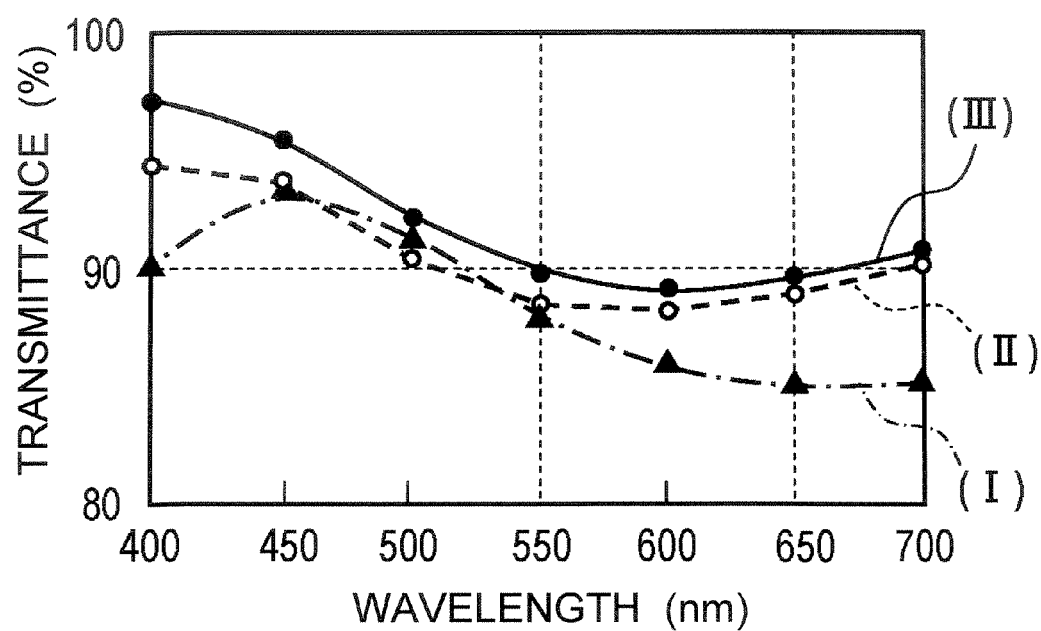
FIG. 18 is a graphical diagram showing an optical transmittance spectrum of the samples.

FIG. 18 is a graphical diagram showing an optical transmittance spectrum of these samples.

The transmittance of the ITO electrode 15 is determined by subtracting the optical absorption of the glass substrate from optical transmittance measured at room temperature.

In nearly all of the wavelength bands, the optical transmittance of the ITO electrode 15 shows a tendency to increase as the substrate temperature during film growth increases. Crystallization of the ITO electrode 15 begins at 150° C. or more. Thus it turned out that, at a substrate temperature of 250° C., for example, the optical transmittance becomes as high as 88% or more in the wavelength region of 550 nanometers (green) to 700 nanometers (red).

Second Embodiment

Figure 19:
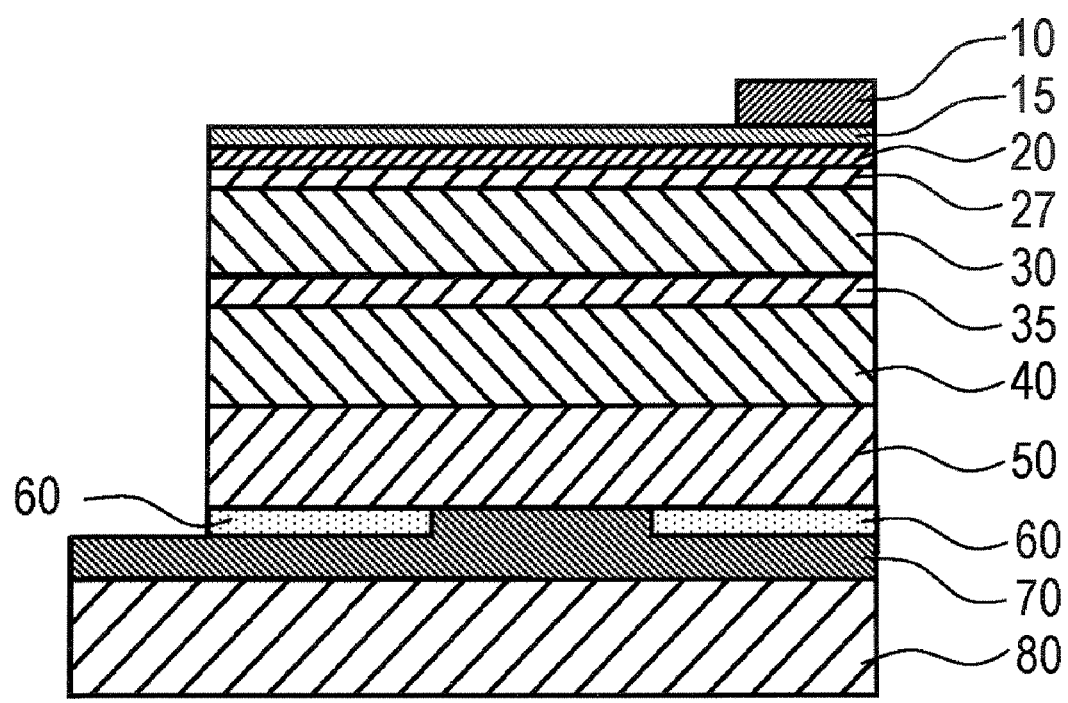
FIG. 19 is a schematic cross section illustrating a light emitting diode according to a second embodiment of the invention.

FIG. 19 is a schematic cross section illustrating a light emitting diode according to a second embodiment of the invention. With regard to this and the following figures, elements similar to those described with reference to FIGS. 1 to 18 are marked with the same reference numerals and not described in detail.

In this example, instead of the composition modulation layer 22 described above with reference to FIG. 1, a metal film 20 is sandwiched between the n-type semiconductor contact layer 27 and the transparent electrode 15.

Preferably, the metal film 20 is made of materials having a smaller work function than the electron affinity of the n-type semiconductor contact layer. Such materials may include a single layer or a multiple-layered thin film of alloys such as MgAg, MgIn, MgCu, MgZn, and MgCa.

For example, the metal film 20 can be made of an alloy of magnesium and silver (MgAg). Here, the composition ratio between magnesium and silver is not limited to 1:1. The n-type semiconductor contact layer 27 can illustratively be made of n-type GaAs, and the transparent electrode 15 can illustratively be made of n-type ITO.

Because the work function of MgAg is lower than the electron affinity of the n-type GaAs contact layer 27, their junction interface can provide a low-resistance ohmic contact. Therefore, good ohmic contact is achieved by providing an MgAg film 20 between the n-type GaAs contact layer 27 and the ITO electrode 15. However, the film thickness of the MgAg film 20 is preferably minimized as long as good ohmic contact is achieved, because the optical transmittance decreases with the increase of the film thickness of the MgAg film 20.

In order to further enhance the effect of inserting the MgAg film 20, the MgAg film 20 and the ITO electrode 15 should be continuously formed by sputtering or the like without exposure to the atmosphere after the oxide film formed on the surface of the n-type GaAs contact layer 27 is removed by sputter etching or the like. To this end, as described above with reference to FIGS. 5 to 7, it is advantageous to use a manufacturing apparatus capable of continuously performing the sputter etching process and the sputtering process.

Furthermore, in this embodiment again, when the film growth of the ITO electrode 15 is performed while being heated at 150° C. or more, crystallization of indium tin oxide proceeds. This can reduce the specific resistance and improve the optical transmittance. Such a structure can achieve a light emitting diode with high emission efficiency.

Next, a method of manufacturing a light emitting diode according to this embodiment is briefly described.

FIG. 20 is a process cross-sectional view illustrating a method of forming an ohmic contact of a light emitting diode of this embodiment.

Figure 20A:
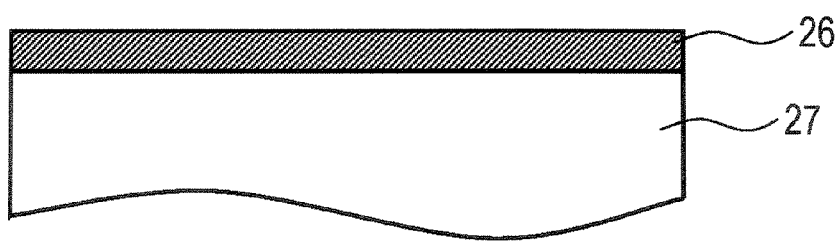
FIG. 20 is a process cross-sectional view illustrating a method of forming an ohmic contact of a light emitting diode of this embodiment.

More specifically, FIG. 20A shows an oxide film 26 formed on the surface of the n-type GaAs contact layer 27. When an oxide film 26 is formed in this manner, the oxide film 26 existing on the surface is first removed by causing argon ions ($Ar^+$) or the like to collide with the surface of the n-type GaAs contact layer 27.

Figure 20B:
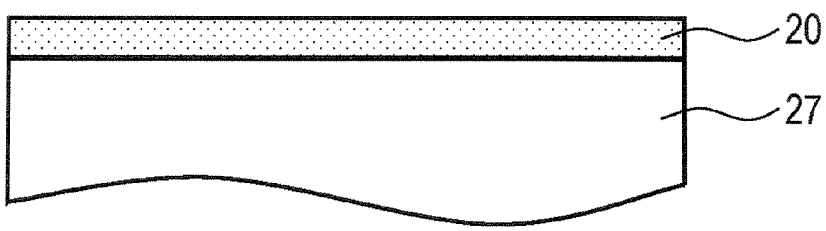
Figure 20C:
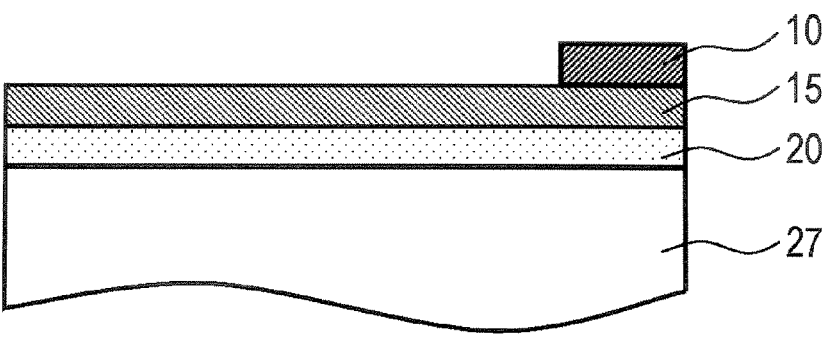

Subsequently, without exposing the surface of the n-type GaAs contact layer 27 to the oxygen-containing atmosphere, an MgAg film 20 is formed by sputtering or the like as shown in FIG. 20B. Furthermore, without exposing the surface of the MgAg film 20 to the oxygen-containing atmosphere, an ITO electrode 15 and an n-type electrode 10 are formed in this order on the MgAg film 20 as shown in FIG. 20C.

As described above, it is preferable to perform the sequence of steps described with reference to FIGS. 20A to 20C in a continuous manner without breaking the vacuum.

In the following, the metal film 20 provided in this embodiment and its function and effect will be described with reference to the experiments performed by the inventor.

Figure 21A:
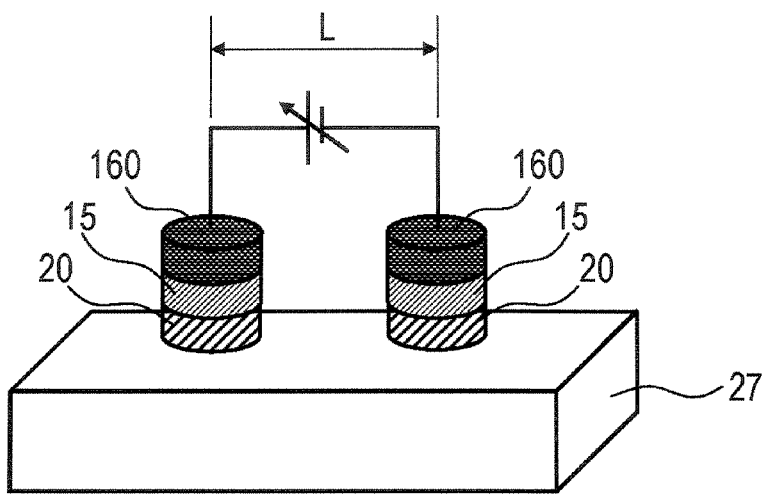
FIGS. 21A and 21B are schematic views of characterization samples prepared by the inventor for use in electric characterization, where
Figure 21B:
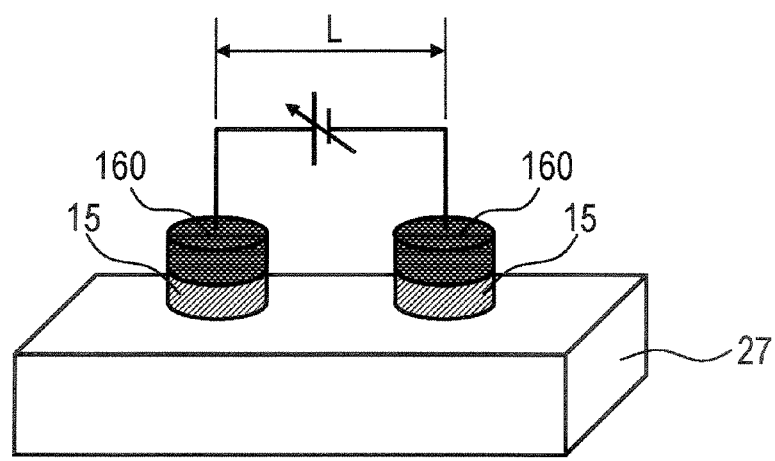

FIGS. 21A and 21B are schematic views of characterization samples prepared by the inventor for use in electric characterization, where FIG. 21A shows a sample with MgAg film 20 and FIG. 21B shows a sample without MgAg film 20.

The method of forming these samples is almost the same as that described above with reference to FIG. 11. The MgAg film 20 is formed by sputtering using an MgAg target. Its film thickness is 2 nanometers.

Figure 22:
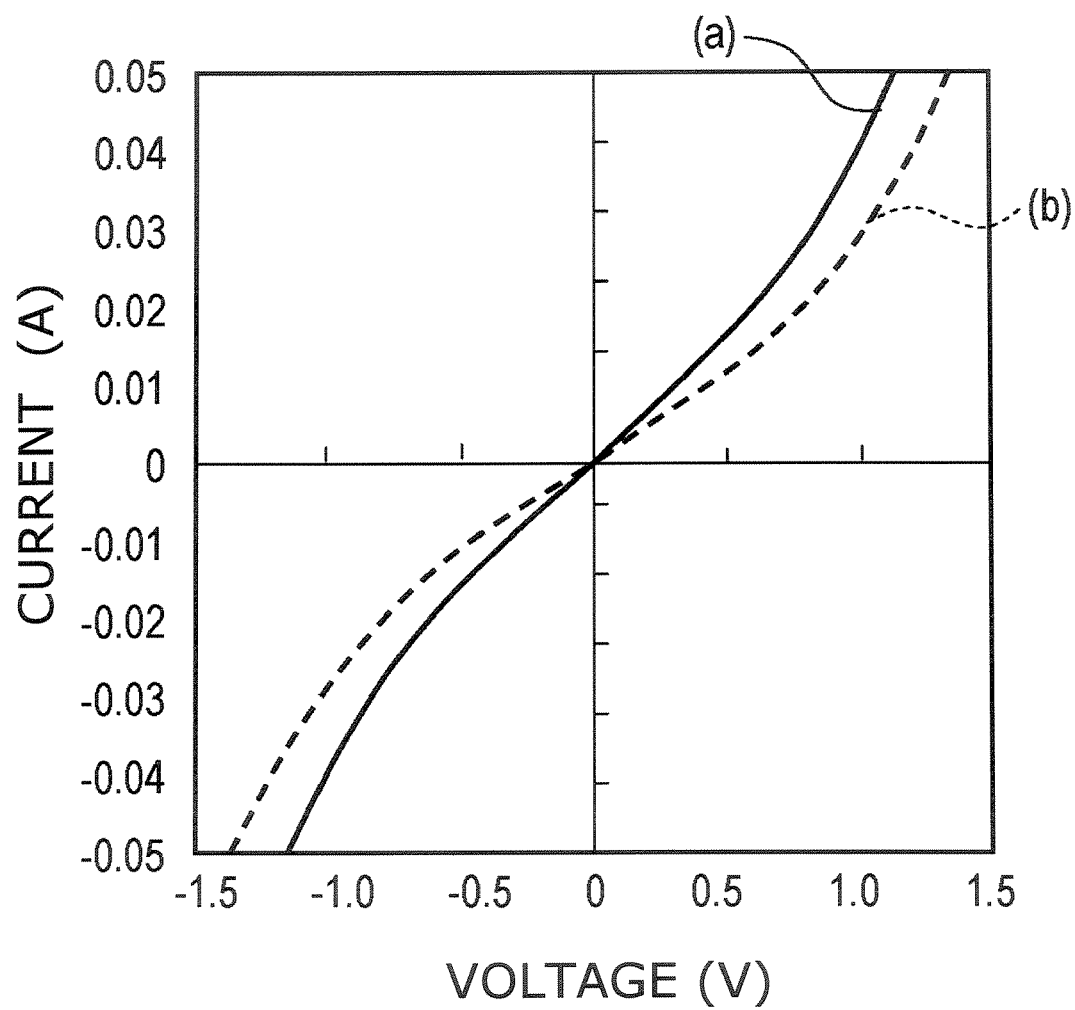
FIG. 22 is a graphical diagram showing current-voltage characteristics for (a) a sample with the MgAg film 20 and (b) a sample without the MgAg film 20.

FIG. 22 is a graphical diagram showing current-voltage characteristics for (a) a sample with the MgAg film 20 and (b) a sample without the MgAg film 20.

In this example, film growth of the MgAg film 20 and the ITO electrode 15 is performed at room temperature. The current-voltage characteristics of the sample (a) with the MgAg film 20 provided between the n-type GaAs contact layer 27 and the ITO electrode 15 is found to have better linearity, and hence larger current and better ohmic contact, than the sample (b) without the MgAg film 20. It is contemplated that this is because the work function of MgAg is as low as about 3.7 eV, which facilitates forming ohmic contact with n-type GaAs of the contact layer.

Figure 23:
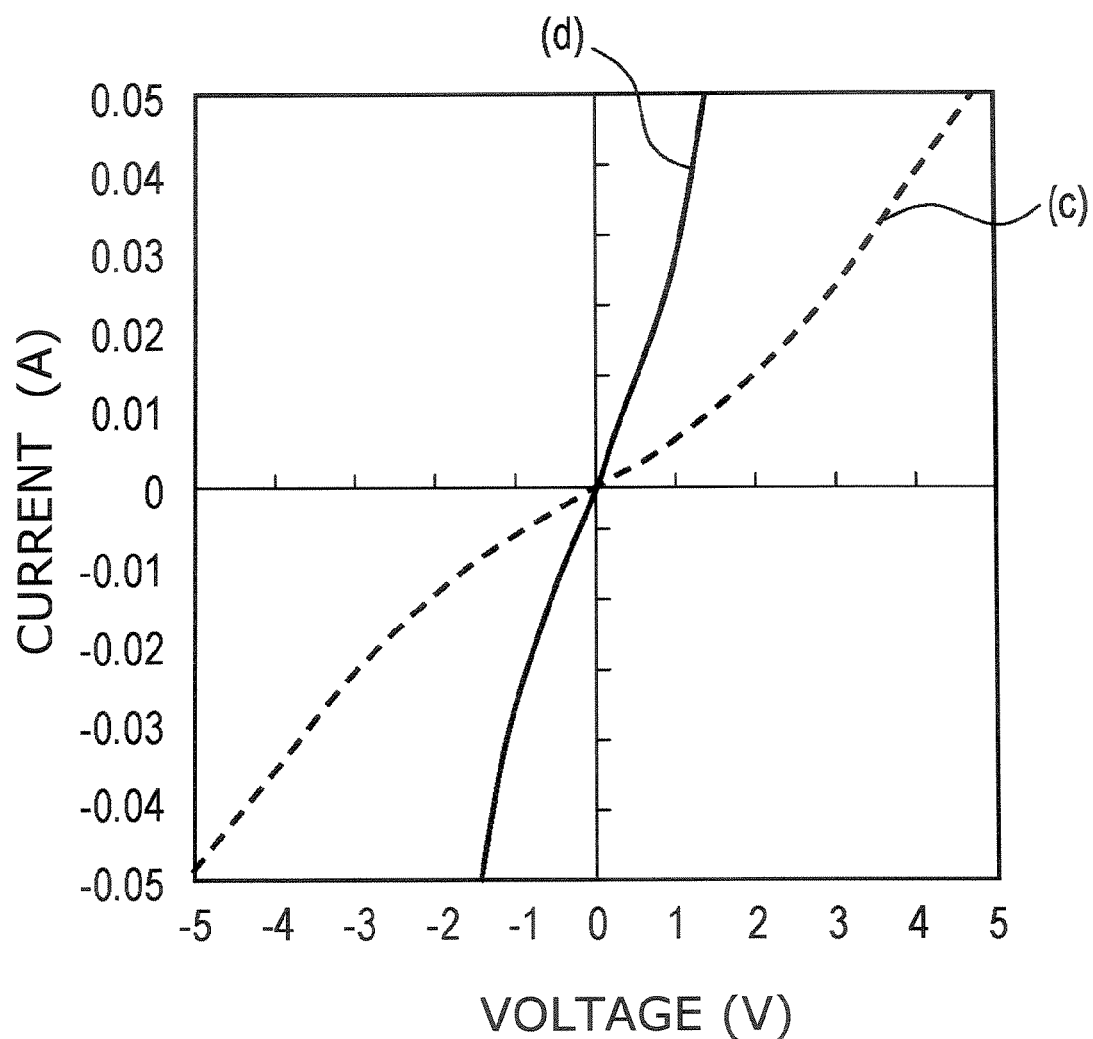
FIG. 23 is a graphical diagram showing current-voltage characteristics for samples with MgAg film 20 where the film growth temperature for the MgAg film 20 and the ITO electrode 15 is set to (c) room temperature and (d) 250° C.

FIG. 23 is a graphical diagram showing current-voltage characteristics for samples with MgAg film 20 where the film growth temperature for the MgAg film 20 and the ITO electrode 15 is set to (c) room temperature and (d) 250° C.

The current-voltage characteristics of the sample (d) where the film growth temperature for the MgAg film 20 and the ITO electrode 15 is set to 250° C. is found to have better linearity and greater slope than the sample (c) formed at room temperature. It is contemplated that this reflects reduction of contact resistance due to the increased substrate temperature during film formation, which leads to a better ohmic contact. Contribution of the effect of reduced specific resistance is also contemplated, which results from the improved film quality of the ITO electrode 15 due to the increased substrate temperature.

Figure 24:
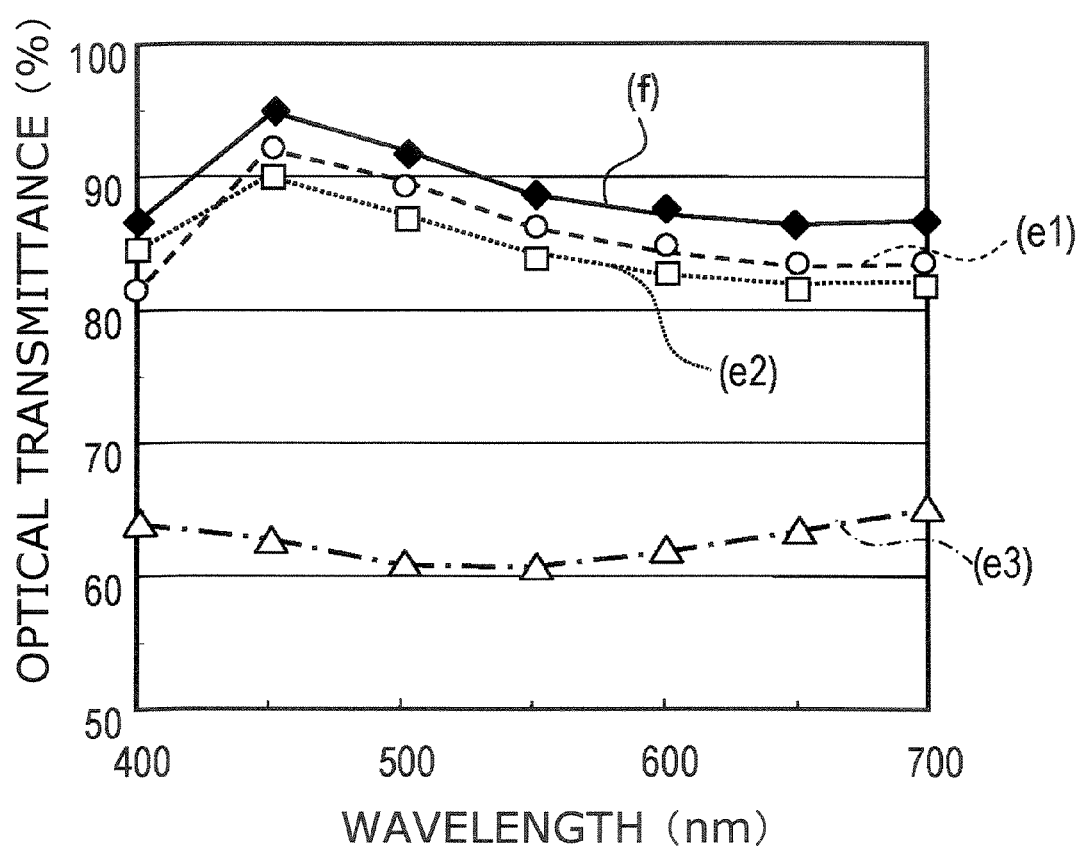
FIG. 24 is a graphical diagram illustrating the relationship between the film thickness and the optical transmittance of MgAg film.

FIG. 24 is a graphical diagram illustrating the relationship between the film thickness and the optical transmittance of MgAg film.

In the sample used here, an MgAg film 20 and an ITO electrode 15 are formed on a glass substrate at a substrate temperature of 250° C. The sample (f) is a characterization sample where an ITO electrode 15 is formed without the MgAg film 20. In the samples (e1), (e2), and (e3), the MgAg film 20 has a film thickness of 1, 2, and 5 nanometers, respectively. The optical transmittance is evaluated on the assumption that the optical transmittance of the glass substrate 175 is 100%.

When the MgAg film 20 has a film thickness of (e1) 1 nanometer or (e2) 2 nanometers, reduction of optical transmittance has little effect, which is 2% or less as compared to the sample (f) made of the ITO electrode 15 alone. Even when the MgAg film 20 has a film thickness of 5 nanometers (e3), the optical transmittance is reduced to some extent but the reduction remains within about 20%. That is, from the viewpoint of optical transmittance, the film thickness of the MgAg film 20 is preferably 5 nanometers or less. More preferably, when it is 2 nanometers or less, reduction of transmittance is negligible.

As described above, this embodiment can achieve good ohmic contact and improve carrier injection efficiency by providing the MgAg film 20 between the n-type GaAs contact layer 27 and the ITO electrode 15. When the MgAg film 20 has a film thickness of 5 nanometers or less, the effect of decreasing the light extraction efficiency is irrelevant.

Embodiments of the invention have been described with reference to the examples. However, the invention is not limited to these examples.

For example, the method of forming a composition modulation layer in the first embodiment and a metal layer in the second embodiment, the material and thickness of these layers, and the material, formation method, heat treatment temperature, and manufacturing apparatus for the contact layer that are adapted by those skilled in the art are also encompassed within the scope of the invention as long as they include the features of the invention.

The invention claimed is:

1. A light emitting device comprising:
   a light emitting layer;
   an n-type contact layer made of a compound provided on the light emitting layer;
   a composition modulation layer provided on the n-type contact layer, the composition modulation layer being formed by sputter etching a surface of n-type contact layer to produce a plurality of elements which constitute the compound, the composition modulation layer including defect levels formed by the sputter etching, and a composition ratio of one of the plurality of elements being higher in the composition modulation layer than in the compound; and
   a transparent electrode provided on the composition modulation layer,
   an ohmic contact being formed by sandwiching the composition modulation layer between the n-type contact layer and the transparent electrode.

2. A light emitting device according to claim 1, wherein
   the compound is a group III-V compound semiconductor, and
   the one element is a group III element.

3. A light emitting device according to claim 1, wherein
   the compound is GaAs, and
   the one element is Ga.

4. A light emitting device according to claim 3, wherein the composition ratio of Ga with respect to As is not less than 1.95 in the composition modulation layer.

5. A light emitting device according to claim 3, wherein a thickness of the n-type contact layer is not greater than 100 nanometers.

6. A light emitting device according to claim 1, wherein the transparent electrode is made of indium tin oxide.

* * * * *